(12) United States Patent
Williams et al.

(10) Patent No.: US 6,611,469 B2
(45) Date of Patent: Aug. 26, 2003

(54) ASYNCHRONOUS FIFO MEMORY HAVING BUILT-IN SELF TEST LOGIC

(75) Inventors: Kenneth L. Williams, Sherman, TX (US); David Rekieta, McKinney, TX (US); Rakesh Joshi, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/277,851

(22) Filed: Oct. 22, 2002

(65) Prior Publication Data

US 2003/0107937 A1 Jun. 12, 2003

Related U.S. Application Data

(60) Provisional application No. 60/340,752, filed on Dec. 11, 2001.

(51) Int. Cl.[7] ................................................. G11C 7/00
(52) U.S. Cl. .................... 365/221; 365/189.12; 365/220
(58) Field of Search ................................. 365/221, 201, 365/220, 189.04, 189.08, 189.12, 191, 240, 230.09, 189.02

(56) References Cited

U.S. PATENT DOCUMENTS

| 4,779,234 A | 10/1988 | Kaneko et al. |
|---|---|---|
| 4,875,196 A | 10/1989 | Spaderna et al. |
| 4,953,101 A | 8/1990 | Kelleher et al. |
| 4,992,973 A | 2/1991 | Tamura et al. |
| 4,995,040 A | 2/1991 | Best et al. |
| 5,093,269 A | 3/1992 | Leichnitz et al. |
| 5,267,206 A | 11/1993 | Koyabu |
| 5,394,399 A | 2/1995 | Kawasaki et al. |
| 5,420,984 A | 5/1995 | Good et al. |
| 5,513,318 A | 4/1996 | van de Goor et al. |
| 5,978,935 A | 11/1999 | Kim et al. |
| 6,108,802 A | 8/2000 | Kim et al. |
| 6,172,927 B1 * | 1/2001 | Taylor ........................ 365/219 |
| 6,240,031 B1 * | 5/2001 | Mehrotra et al. ........... 365/220 |

* cited by examiner

*Primary Examiner*—Richard Elms
*Assistant Examiner*—Hien Nguyen
(74) *Attorney, Agent, or Firm*—April M. Mosby; Wade James Brady III; Frederick J. Telecky, Jr.

(57) ABSTRACT

An asynchronous First-In-First-Out memory integrated circuit is equipped with a Built-In Self Test logic structure which allows extensive full-frequency asynchronous memory testing requiring minimal external test equipment. Memory input data patterns are generated by write data pattern circuitry responsive to a write clock signal. The write data generator considers the full status of the FIFO memory device. A read data generator provides an expected output data pattern corresponding to the data pattern provided by the write data generator responsive to a read clock signal such that the status of the FIFO memory device is taken into account. A read data error circuit compares the expected output data with the actual output data, indicating any mismatch between the two. Further this asynchronous First-In-First-Out memory device stores information regarding the nature of any mismatches and allows this information to be serially read from its output.

14 Claims, 16 Drawing Sheets

FIG. 3

INPUT DATA

```
1 1 1 1 1 1 1 1 1 1 1 1 1 1 1 1 1 1 1 1 1 1 1 1 1 1 1 1 1 1 1 1 1 1 1 1  <=WORD 1
0 0 0 0 0 0 0 0 0 0 0 0 0 0 0 0 0 0 0 0 0 0 0 0 0 0 0 0 0 0 0 0 0 0 0 0  <=WORD 2
1 1 1 1 1 1 1 1 1 1 1 1 1 1 1 1 1 1 1 1 1 1 1 1 1 1 1 1 1 1 1 1 1 1 1 1  <=WORD 3
0 0 0 0 0 0 0 0 0 0 0 0 0 0 0 0 0 0 0 0 0 0 0 0 0 0 0 0 0 0 0 0 0 0 0 0  <=WORD 4
1 1 1 1 1 1 1 1 1 1 1 1 1 1 1 1 1 1 1 1 1 1 1 1 1 1 1 1 1 1 1 1 1 1 1 1  <=WORD 5
0 0 0 0 0 0 0 0 0 0 0 0 0 0 0 0 0 0 0 0 0 0 0 0 0 0 0 0 0 0 0 0 0 0 0 0  <=WORD 6
1 1 1 1 1 1 1 1 1 1 1 1 1 1 1 1 1 1 1 1 1 1 1 1 1 1 1 1 1 1 1 1 1 1 1 1  <=WORD 7
0 0 0 0 0 0 0 0 0 0 0 0 0 0 0 0 0 0 0 0 0 0 0 0 0 0 0 0 0 0 0 0 0 0 0 0  <=WORD 8
1 1 1 1 1 1 1 1 1 1 1 1 1 1 1 1 1 1 1 1 1 1 1 1 1 1 1 1 1 1 1 1 1 1 1 1  <=WORD 9
0 0 0 0 0 0 0 0 0 0 0 0 0 0 0 0 0 0 0 0 0 0 0 0 0 0 0 0 0 0 0 0 0 0 0 0  <=WORD 10
1 1 1 1 1 1 1 1 1 1 1 1 1 1 1 1 1 1 1 1 1 1 1 1 1 1 1 1 1 1 1 1 1 1 1 1  <=WORD 11
0 0 0 0 0 0 0 0 0 0 0 0 0 0 0 0 0 0 0 0 0 0 0 0 0 0 0 0 0 0 0 0 0 0 0 0  <=WORD 12
1 1 1 1 1 1 1 1 1 1 1 1 1 1 1 1 1 1 1 1 1 1 1 1 1 1 1 1 1 1 1 1 1 1 1 1  <=WORD 13
0 0 0 0 0 0 0 0 0 0 0 0 0 0 0 0 0 0 0 0 0 0 0 0 0 0 0 0 0 0 0 0 0 0 0 0  <=WORD 14
1 1 1 1 1 1 1 1 1 1 1 1 1 1 1 1 1 1 1 1 1 1 1 1 1 1 1 1 1 1 1 1 1 1 1 1  <=WORD 15
0 0 0 0 0 0 0 0 0 0 0 0 0 0 0 0 0 0 0 0 0 0 0 0 0 0 0 0 0 0 0 0 0 0 0 0  <=WORD 16
```

RAM DATA PATTERN

| D35-D27 | D26-D18 | D17-D9 | D8-D0 | |
|---|---|---|---|---|
| 1 1 1 1 1 1 1 1 1 | 1 1 1 1 1 1 1 1 1 | 1 1 1 1 1 1 1 1 1 | 1 1 1 1 1 1 1 1 1 | <=WORD 1 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 5 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 9 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 13 |

| D35-D27 | D26-D18 | D17-D9 | D8-D0 | |
|---|---|---|---|---|
| 0 0 0 0 0 0 0 0 0 | 0 0 0 0 0 0 0 0 0 | 0 0 0 0 0 0 0 0 0 | 0 0 0 0 0 0 0 0 0 | <=WORD 2 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 6 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 10 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 14 |

| D35-D27 | D26-D18 | D17-D9 | D8-D0 | |
|---|---|---|---|---|
| 1 1 1 1 1 1 1 1 1 | 1 1 1 1 1 1 1 1 1 | 1 1 1 1 1 1 1 1 1 | 1 1 1 1 1 1 1 1 1 | <=WORD 3 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 7 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 11 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 15 |

| D35-D27 | D26-D18 | D17-D9 | D8-D0 | |
|---|---|---|---|---|
| 0 0 0 0 0 0 0 0 0 | 0 0 0 0 0 0 0 0 0 | 0 0 0 0 0 0 0 0 0 | 0 0 0 0 0 0 0 0 0 | <=WORD 4 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 8 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 12 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 16 |

FIG. 4

INPUT DATA

```
1 1 1 1 1 1 1 1 1 1 1 1 1 1 1 1 1 1 1 1 1 1 1 1 1 1 1 1 1 1 1 1 1 1 1 1  <=WORD 1
1 1 1 1 1 1 1 1 1 1 1 1 1 1 1 1 1 1 1 1 1 1 1 1 1 1 1 1 1 1 1 1 1 1 1 1  <=WORD 2
1 1 1 1 1 1 1 1 1 1 1 1 1 1 1 1 1 1 1 1 1 1 1 1 1 1 1 1 1 1 1 1 1 1 1 1  <=WORD 3
1 1 1 1 1 1 1 1 1 1 1 1 1 1 1 1 1 1 1 1 1 1 1 1 1 1 1 1 1 1 1 1 1 1 1 1  <=WORD 4
0 0 0 0 0 0 0 0 0 0 0 0 0 0 0 0 0 0 0 0 0 0 0 0 0 0 0 0 0 0 0 0 0 0 0 0  <=WORD 5
0 0 0 0 0 0 0 0 0 0 0 0 0 0 0 0 0 0 0 0 0 0 0 0 0 0 0 0 0 0 0 0 0 0 0 0  <=WORD 6
0 0 0 0 0 0 0 0 0 0 0 0 0 0 0 0 0 0 0 0 0 0 0 0 0 0 0 0 0 0 0 0 0 0 0 0  <=WORD 7
0 0 0 0 0 0 0 0 0 0 0 0 0 0 0 0 0 0 0 0 0 0 0 0 0 0 0 0 0 0 0 0 0 0 0 0  <=WORD 8
1 1 1 1 1 1 1 1 1 1 1 1 1 1 1 1 1 1 1 1 1 1 1 1 1 1 1 1 1 1 1 1 1 1 1 1  <=WORD 9
1 1 1 1 1 1 1 1 1 1 1 1 1 1 1 1 1 1 1 1 1 1 1 1 1 1 1 1 1 1 1 1 1 1 1 1  <=WORD 10
1 1 1 1 1 1 1 1 1 1 1 1 1 1 1 1 1 1 1 1 1 1 1 1 1 1 1 1 1 1 1 1 1 1 1 1  <=WORD 11
1 1 1 1 1 1 1 1 1 1 1 1 1 1 1 1 1 1 1 1 1 1 1 1 1 1 1 1 1 1 1 1 1 1 1 1  <=WORD 12
0 0 0 0 0 0 0 0 0 0 0 0 0 0 0 0 0 0 0 0 0 0 0 0 0 0 0 0 0 0 0 0 0 0 0 0  <=WORD 13
0 0 0 0 0 0 0 0 0 0 0 0 0 0 0 0 0 0 0 0 0 0 0 0 0 0 0 0 0 0 0 0 0 0 0 0  <=WORD 14
0 0 0 0 0 0 0 0 0 0 0 0 0 0 0 0 0 0 0 0 0 0 0 0 0 0 0 0 0 0 0 0 0 0 0 0  <=WORD 15
0 0 0 0 0 0 0 0 0 0 0 0 0 0 0 0 0 0 0 0 0 0 0 0 0 0 0 0 0 0 0 0 0 0 0 0  <=WORD 16
```

RAM DATA PATTERN

| D35-D27 | D26-D18 | D17-D9 | D8-D0 | |
|---|---|---|---|---|
| 1 1 1 1 1 1 1 1 1 | 1 1 1 1 1 1 1 1 1 | 1 1 1 1 1 1 1 1 1 | 1 1 1 1 1 1 1 1 1 | <=WORD 1 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 5 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 9 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 13 |

| 1 1 1 1 1 1 1 1 1 | 1 1 1 1 1 1 1 1 1 | 1 1 1 1 1 1 1 1 1 | 1 1 1 1 1 1 1 1 1 | <=WORD 2 |
|---|---|---|---|---|
| 0 0 0 0 0 0 0 0 0 | 0 0 0 0 0 0 0 0 0 | 0 0 0 0 0 0 0 0 0 | 0 0 0 0 0 0 0 0 0 | <=WORD 6 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 10 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 14 |

| 1 1 1 1 1 1 1 1 1 | 1 1 1 1 1 1 1 1 1 | 1 1 1 1 1 1 1 1 1 | 1 1 1 1 1 1 1 1 1 | <=WORD 3 |
|---|---|---|---|---|
| 0 0 0 0 0 0 0 0 0 | 0 0 0 0 0 0 0 0 0 | 0 0 0 0 0 0 0 0 0 | 0 0 0 0 0 0 0 0 0 | <=WORD 7 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 11 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 15 |

| 1 1 1 1 1 1 1 1 1 | 1 1 1 1 1 1 1 1 1 | 1 1 1 1 1 1 1 1 1 | 1 1 1 1 1 1 1 1 1 | <=WORD 4 |
|---|---|---|---|---|
| 0 0 0 0 0 0 0 0 0 | 0 0 0 0 0 0 0 0 0 | 0 0 0 0 0 0 0 0 0 | 0 0 0 0 0 0 0 0 0 | <=WORD 8 |
| 1 1 1 1 1 1 1 1 1 | 1 1 1 1 1 1 1 1 1 | 1 1 1 1 1 1 1 1 1 | 1 1 1 1 1 1 1 1 1 | <=WORD 12 |
| 0 0 0 0 0 0 0 0 0 | 0 0 0 0 0 0 0 0 0 | 0 0 0 0 0 0 0 0 0 | 0 0 0 0 0 0 0 0 0 | <=WORD 16 |

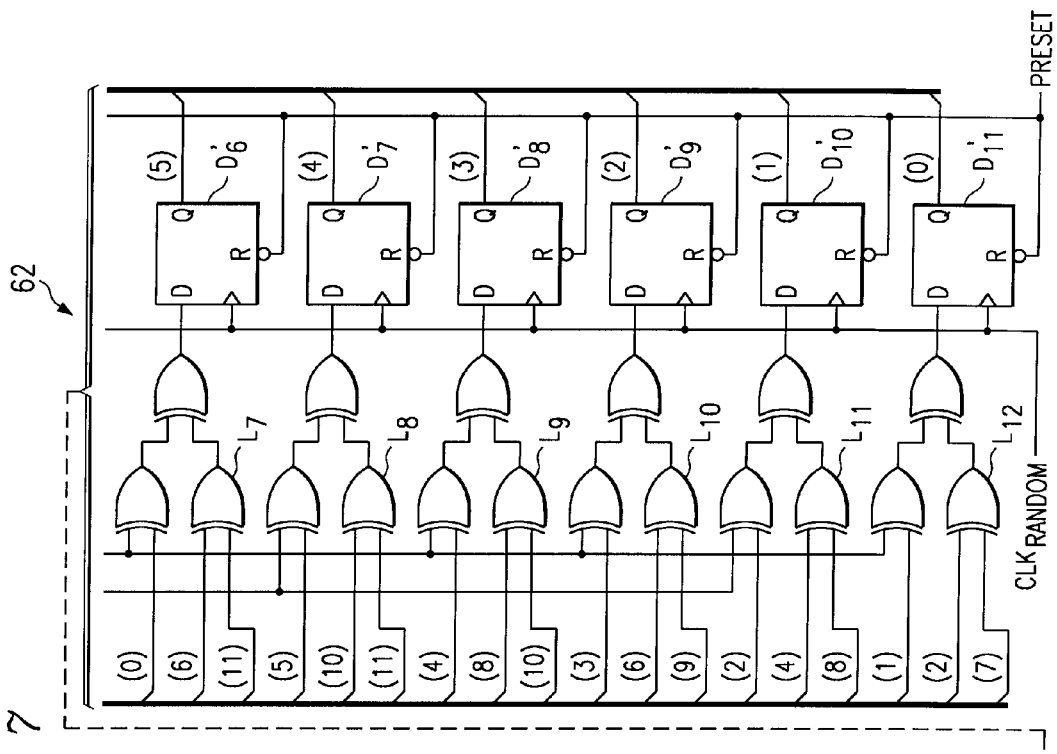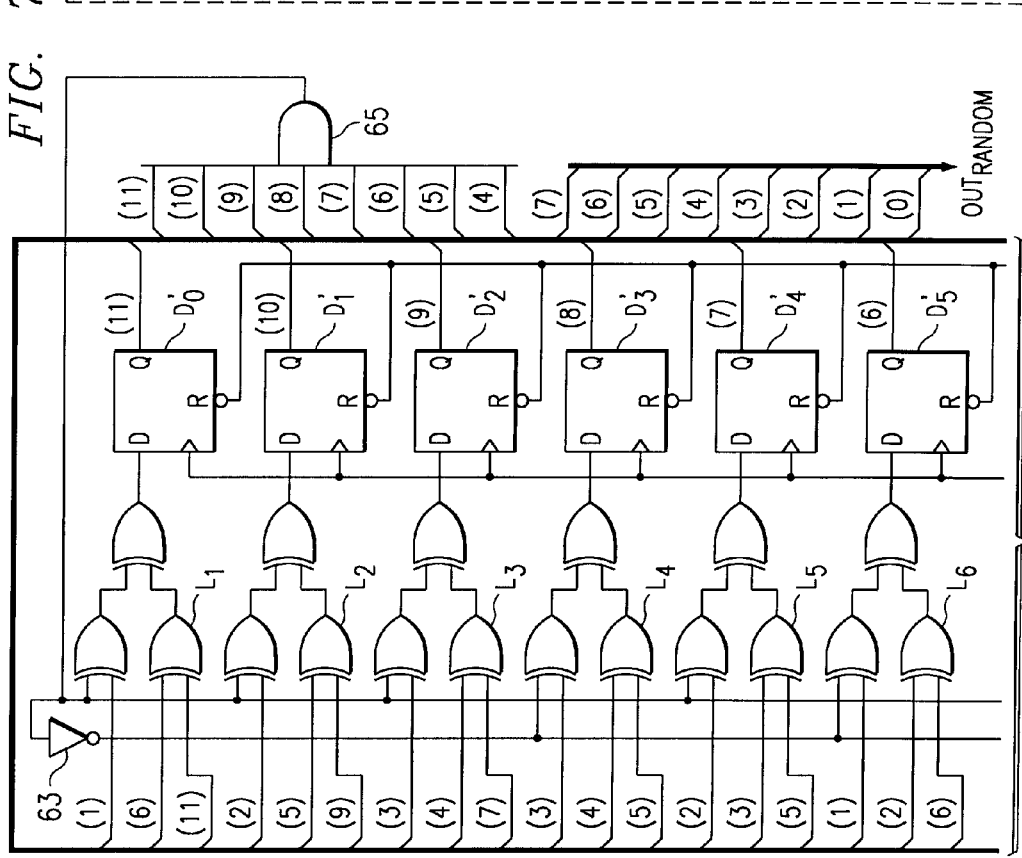
FIG. 7

ASYNCHRONOUS FIFO MEMORY HAVING BUILT-IN SELF TEST LOGIC

This application claims priority under 35 USC §119(e)(1) of provisional application Ser. No. 60/340,752, filed Dec. 11, 2001.

FIELD OF THE INVENTION

The present invention relates to memory, and, more particularly, to a first-in/first-out memory having a built-in self test for an asynchronous memory.

BACKGROUND OF THE INVENTION

Asynchronous First-in, First-out (FIFO) memory devices allow data to be written to and read from a memory array at independent data rates. Reading or writing of data is done independently using separate asynchronous data blocks. Testing of the memory device after silicon fabrication ensures that all bits in the memory array function properly under any condition in which each device will, in all probability, be exposed to when inserted into any system. A memory-based FIFO utilizes a Random Access Memory (RAM) as its storage element. This RAM may have a single (combined) read/write port or separate (dual) ports for reading and writing data. The RAM further includes n storage rows or words, where n is an integer. Conventionally, for data storage in a computer system, FIFO memory devices typically include dual-port static RAMs. Simultaneous writing to and reading from these RAMs is required with few restrictions on signal timing. Any undesirable interaction between these writes and reads may lead to a write or read failure.

Conventional integrated circuit (IC) test equipment is able to perform extensive memory testing for a majority of possible failure mechanisms. This asynchronous testing is performed using separate and external testing equipment. This system uses programmable logic to generate input data patterns responsive to a write clock signal and expected output patterns responsive to a read clock signal. Other logic within the system compares the expected output data to the actual output data and indicates any mismatches between the two as well as information on the nature of the mismatch. With increasing data rates in FIFO memories, however, such a system is costly, time consuming, and difficult to implement. In addition, this equipment is generally not able to fully emulate an asynchronous system, especially at maximum specified operating frequencies.

From a reliability standpoint, it is desirable to test all aspects of the FIFO memory device. Yet, FIFO memory devices are conventionally tested using parametric, functional and asynchronous tests. Such tests, however, do not reliably detect all possible faults, including faults associated with the memory, the addressing mechanism, nor the overall functionality of the FIFO memory device. Thus, while fault models and tests for detecting faults in RAMs are known, presently no fault models and tests exist for fully testing dual-port asynchronous FIFO memory devices.

Therefore, a need exists for a FIFO memory including Built-In Self Test (BIST) logic having minimal external test equipment required to implement full frequency asynchronous testing.

SUMMARY OF THE INVENTION

To address the above-discussed deficiencies of testing of asynchronous FIFO memory, the present invention teaches an asynchronous FIFO memory having built-in self test logic. The FIFO memory in accordance with the present invention includes a RAM connected to read and write address registers whereby a status flag generator connects to the read and write address registers to provide ready input and ready output signal. When the FIFO memory is not full, the ready input signal indicates that the FIFO memory is ready to accept a data write. The ready output signal indicates that valid data is on the output data bus. Further, the FIFO memory device includes a write and read data generator connected to the input data bus to receive a portion of the word to define a pattern sequence select used to generate write and expected read data patterns corresponding to each of the words in memory. A multiplexer connects the write data generator and the input data bus to the RAM; whereby, in response to a test mode signal, the multiplexer switches to provide words from the input data bus to the RAM in a normal mode of operation and to provide words form the write data generator to the RAM in a testing mode of operation. A read data error register receives data patterns generated from the read data generator and the output data bus to compare each bit on the output data bus with each bit of the expected read data pattern and, thereby, generate error signals regarding data mismatches as well as the nature of the mismatch to any external device which monitors the FIFO device during the testing mode of operation.

Advantages of this design include but are not limited to a inexpensive FIFO memory device having Built-In Self Test (BIST) logic that uses minimal external test equipment required to implement full frequency asynchronous testing of the memory device.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 3 displays the input data for the test entitled "chip stripes";

FIG. 4 displays the input data for the test entitled "ram stripes";

FIG. 7 illustrates the random number generator in accordance with the present invention;

DETAILED DESCRIPTION OF PREFERRED EMBODIMENTS

Figure 1:
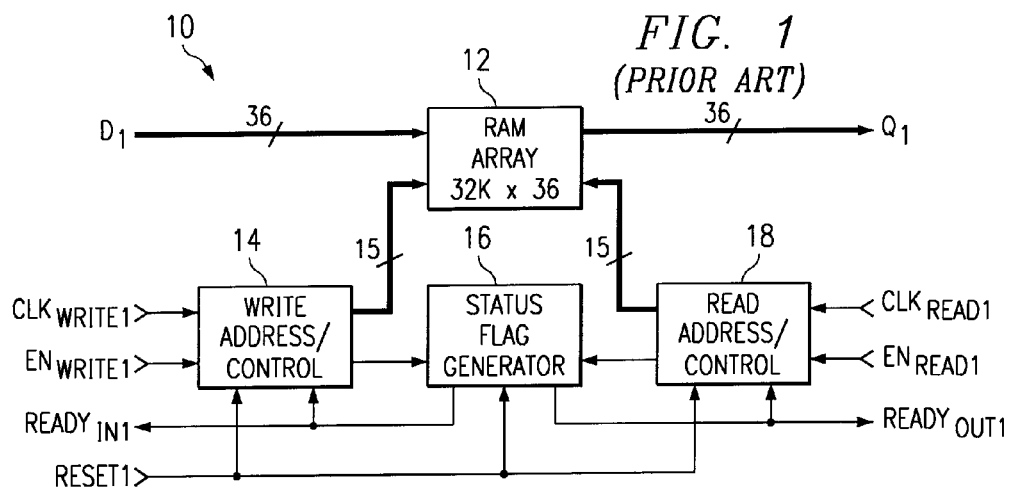
FIG. 1 illustrates a known FIFO memory.

The present invention is best understood by comparison with the prior art. Hence, this detailed description begins with a discussion of the known asynchronous FIFO memory device as shown in FIG. 1. As shown, memory device 10 includes a random access memory (RAM) 12 couples to receive a 36-bit data word from input data bus $D_1$. RAM 12 also couples to receive a 15-bit write address and control signals from a write address/control generator 14 and a 15-bit read address and control signals from a read address/control generator 18. RAM 12 provides an 36-bit data word at output data bus $Q_1$. A status flag generator 16 receives signals from write address/control generator 14 and read address/control generator 18 and provides signals at outputs $Ready_{out1}$ and $Ready_{in1}$ which signify when valid data is on the output data bus $Q_1$ and the input data bus $D_1$, respectively. Write address/control generator 14 couples to receive a write enable signal $EN_{write1}$ and write clock signal $Clk_{write1}$. Read address/control generator 18 couples to receive a read enable signal $EN_{read1}$ and read clock signal $Clk_{read1}$. Write address/control generator 14 and read address/control generator 18 couple to receive the input and output ready signals, $Ready_{in1}$ and $Ready_{out1}$, respectively. A reset signal $Reset_1$ is received for the purpose of resetting memory device 10 specifically resetting status flag generator 16, write address/control generator 14, and read address/control generator 18. A pulse in the reset signal $Reset_1$ also sets the write and read addresses to the first location.

RAM 12 is configured to have 32768 words where each word comprises 36 bits. The first word written at input data bus $D_1$ to memory device 10 automatically appears on output data bus $Q_1$ after a number of read clock cycles $Clk_{read1}$ have transpired without an external read command. This is commonly referred to as a First-Word-Fall-Through type of memory device 10. As a result, the signal delivered by the output $Ready_{out1}$ goes high, indicating that there is valid data on output data bus $Q_1$. The write clock signal $Clk_{write1}$ is generally a free-running system clock. Memory writes are enabled when the input $EN_{write1}$ and the output $Ready_{in1}$ are high which means FIFO memory device 10 is not full. After a memory write is initiated, a new memory write address is generated for the next write. If the last write caused the last vacant address to be written to, then FIFO memory device 10 becomes full, setting output $Ready_{in1}$ low. Read clock signal $Clk_{read1}$ is generally a free-running system clock which can be independent of write clock signal $Clk_{write1}$. Memory reads are enabled when the read enable signal $EN_{read1}$ and output ready signal $Ready_{out1}$ are high which translates to mean that memory device 10 is not empty and that there is valid data on the output data bus $Q_1$. After a memory read is initiated, a new memory read address is generated for the next read. If the latest read caused the last RAM occupied address to be read from, or if a pulse in the reset signal occurs, then memory device 10 is empty. As a result, node $Ready_{out1}$ is set low, which indicates that data on output data bus $Q_1$ is not valid.

Specifically, as shown in FIG. 3, the 32K-word by 36-bit RAM array 12 consists of four groups of four separate smaller RAM arrays, each consisting of 8K-words by 9-bits. Each 36-bit word is distributed across each of the four groups of four separate smaller RAM arrays. The four groups are accessed in an interleaved sequence. During a write sequence, the first 36-bit word written goes to the first group of four. The next 36-bit word goes to the second group of four. The next two 36-bit words go to the third and fourth groups. Thereafter, the fifth word starts over with the first group and the pattern repeats. For a read sequence, words are retrieved from the four groups of memory 12 in the same fashion.

Figure 2:
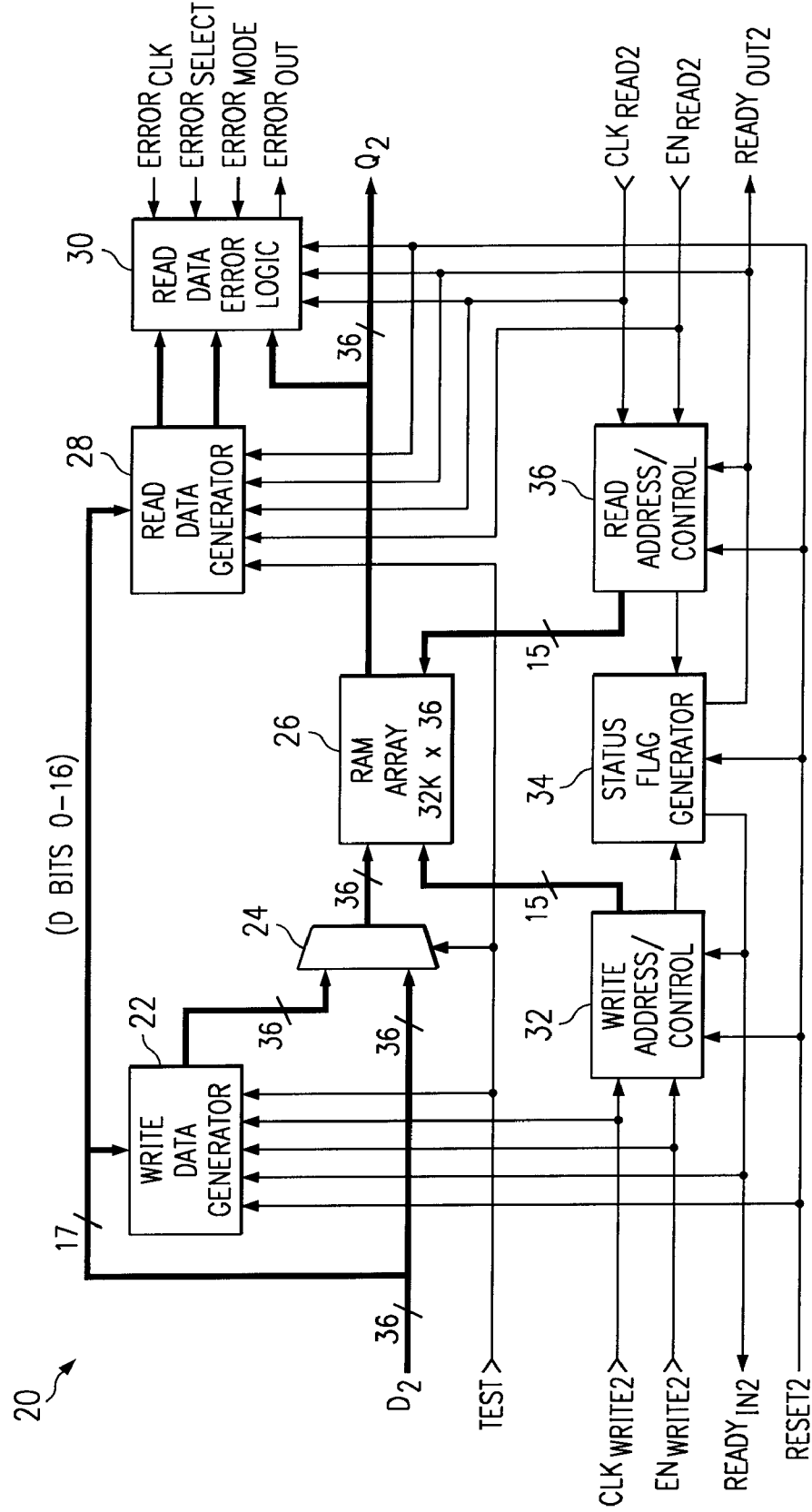
FIG. 2 shows an asynchronous FIFO memory device in accordance with the present invention.

FIG. 2 is a block diagram of asynchronous FIFO memory device 20 having Built-In Self-Testing logic, 22, 24, 28, and 30, in accordance with the present invention. As shown, memory device 20 includes write data generator 22 and input data bus $D_2$ which provide inputs for multiplexer 24. Multiplexer 24, in response to a test signal $Test_2$, switches to provide data from the input data bus $D_2$ to RAM 26 in a normal mode of operation and to provide data from write data generator 22 to RAM 26 in a test mode of operation. RAM 26 also couples to receive a 15-bit read address/control signal from a read address/control generator 36 and a 15-bit write address/control signal from a write address/control generator 32. RAM 26 provides an 36-bit data word on output data bus $Q_2$ to read data error logic 30. Read data generator 28 and write data generator 22 both couple to receive a portion of the input data word from input data bus $D_2$ which defines a pattern sequence select. As is shown for this embodiment, the pattern sequence select is a 17-bit word. The pattern sequence select is used to generate an expected read data pattern which corresponds to the write data pattern generated by write data generator 22. Write data generator 22 also receives write clock signal $Clk_{write2}$, write enable signal $EN_{write2}$, and input ready signal $Ready_{in2}$.

Status flag generator 34 receives signals from the write address/control generator 32 and the read address/control generator 36 and provides signals at outputs $Ready_{out2}$ and $Ready_{in2}$ which signify when valid data is on the output data bus $Q_2$ and the input data bus $D_2$, respectively. Write address/control generator 32 couples to receive write enable signal $EN_{write2}$ and write clock signal $Clkwrite_2$. Read address/control generator 36 couples to receive a read enable signal $EN_{read2}$ and read clock signal $Clk_{read2}$. Write address/control generator 32 and read address/control generator 36 couple to receive the input and output ready signals, $Ready_{in2}$ and $Ready_{out2}$, respectively.

Read data generator 28 provides output to the read data error logic register 30. Read clock signal $Clk_{read2}$ is the clock signal for read data generator 28 and read data error logic 30. In addition, read data error logic 30 couples to receive input signals $Error_{clk}$, $Error_{select}$, and $Error_{mode}$ which can be separate external inputs or outputs. In the alternative, the functions of signals $Error_{clk}$, $Error_{select}$, and $Error_{mode}$ can be shared with existing IC terminals whose normal functions are not needed in test mode. Further, read data error logic 30 couples to receive an output ready signal from the status generator 34.

A pulse on reset signal $Reset_2$ provided to write data generator 22, write address/control generator 32, status flag generator 34, read address/control generator 36, read data generator 28 and read data error logic 30 will clear all registers for the purpose of resetting memory device 20. Specifically, when a pulse in the reset signal $Reset_2$ occurs, the write and read addresses are set to the first location in RAM 26, the output ready signal $Ready_{out}$ is set to low, the input ready signal $Ready_{in}$ is set to high, and the write and read data generators 22 and 28 are set to the beginning of their data pattern sequence.

Test signal $Test_2$ connects to write data generator 22, multiplexer 24, and read data generator 28 to switch memory device 20 from a normal mode of operation to a testing mode of operation and visa versa. Test signal $Test_2$ can be an external input or an internally generated signal set high by performing a test mode initiation procedure. When test signal $Test_2$ is high, the internally generated test data from write data generator 22 is selected for writing to RAM 26, whereby input data bus $D_2$ is ignored. Thus, test signal $Test_2$ effectively prompts write data generator 22 and read data generator 28 to generate write and expected read data patterns.

During a low-to-high transition on write clock signal $Clk_{write}$, write data generator 22 generates a new write word given that signals: test signal $Test_2$, the write enable signal $EN_{write2}$, and input read signal $Ready_{in2}$, are all high. During a low-to-high transition on read clock signal $Clk_{read}$, read data generator 28 generates a new expected read data word given that signals: test signal $Test_2$, read enable signal $EN_{read2}$, and output ready signal $Ready_{out2}$, are all high. Several different types of data patterns can be selected for writes and reads. Since the data on input data bus $D_2$ is not used as direct input to RAM 26 during test mode operation, this same data on input bus $D_2$ may be used to select which types of data patterns to test memory device 20.

The write and expected read data pattern sequence is determined by the pattern sequence select represented by the values on input data bus $D_2$ bits 0–16 noting the table below. For each bit of input data bus $D_2$ that is high, the corresponding pattern is included in the pattern sequence written to RAM 26. The number of writes and reads for each pattern equals the depth of the FIFO memory device 20 which may be 32768 words as is shown in this embodiment. Once the end of a sequence is reached, it begins again. Note that regardless of the patterns selected, the pattern having all 1's will always be initiated as the first pattern the first time through the sequence.

The following table discloses the sequence of selectable data patterns, identifying the data pattern codes and respective data pattern names which are decoded from the pattern sequence select.

| D bit | Data Pattern Code | Data Pattern Name |
|---|---|---|
| 0 | 00000 | All 1's |
| 1 | 00001 | All 0's |
| 2 | 00010 | Chip Stripe |
| 3 | 00011 | Chip Stripe Inverted |
| 4 | 00100 | RAM Stripe |
| 5 | 00101 | RAM Stripe inverted |
| 6 | 00110 | Chip Checkerboard |
| 7 | 00111 | Chip Checkerboard Inverted |
| 8 | 01000 | RAM Checkerboard |
| 9 | 01001 | RAM Checkerboard Inverted |
| 10 | 01010 | 3-bit Walking 1 |

-continued

| D bit | Data Pattern Code | Data Pattern Name |
|---|---|---|
| 11 | 01011 | 3-bit Walking 1 |
| 12 | 01100 | 3-bit Walking 1 |
| 13 | 01101 | 3-bit walking 0 |
| 14 | 01110 | 3-bit walking 0 |
| 15 | 01111 | 3-bit walking 0 |
| 16 | 10000 | Pseudo Random |

The data pattern entitled "All 1's" denotes that al bits are high for all words. The data pattern entitled "All 0's" denotes that all bits are low for all words. "Chip Stripe," as is shown in FIG. 3, denotes that all bits are low, then all bits are high, toggling on each clock pulse. The inverse of this pattern is entitled "Inverse of Chip Stripe." As illustrated in FIG. 4, "RAM Stripe," denotes that all bits are high for four words and, in the alternative, all bits low for four words. This sequence is repeated. This pattern causes each individual small RAM arrays to receive alternating words of all 0's and all 1's, as shown. The inverse of this pattern is entitled "RAM Stripe Inverted."

The "Chip Checkerboard" pattern is similar to a checker board pattern and appears as follows:
 Word #1—10101010101010101010101010101010
 Word #2—01010101010101010101010101010101
 Word #3—10101010101010101010101010101010
 Word #4—01010101010101010101010101010101
 etc.
The inverse of this pattern is entitled "Chip Checkerboard Inverted."

The "RAM Checkerboard" pattern sequence denotes where all bits are high for a fixed number of words and then all bits are low for the same number of words. This pattern is repeated a fixed number of times and then inverted. Since each RAM contains memory cells in an array of rows and columns, this pattern causes each column to have alternating 1's and 0's throughout and any two adjacent columns to have opposite patterns. Thus, for each memory cell, all vertically and horizontally adjacent cells contain opposite data, while all diagonally adjacent cells, the same data. The inverse of this pattern is entitled "RAM Checkerboard Inverted."

The "3-Bit Walking 1's" pattern appears as follows:
 Word #1—100100100100100100100100100100
 Word #2—010010010010010010010010010010
 Word #3—001001001001001001001001001001
 Word #4—100100100100100100100100100100
 etc.
This pattern is repeated three times so that each memory location eventually receives all three values in a three-bit sequence. The inverse of this pattern is entitled "3-Bit Walking 0's."

The "Pseudo-Random" pattern denotes a pattern that repeats every nine bits across the word with bits (0–17) in reverse order of bits (18–35), wherein the sequence of words repeats after a fixed odd number of words. Each time this pattern is entered in the sequence of patterns, the word sequence starts where it left from the previous time. Thus, each memory location will eventually receive each word of the pseudo-random sequence.

Figure 5:
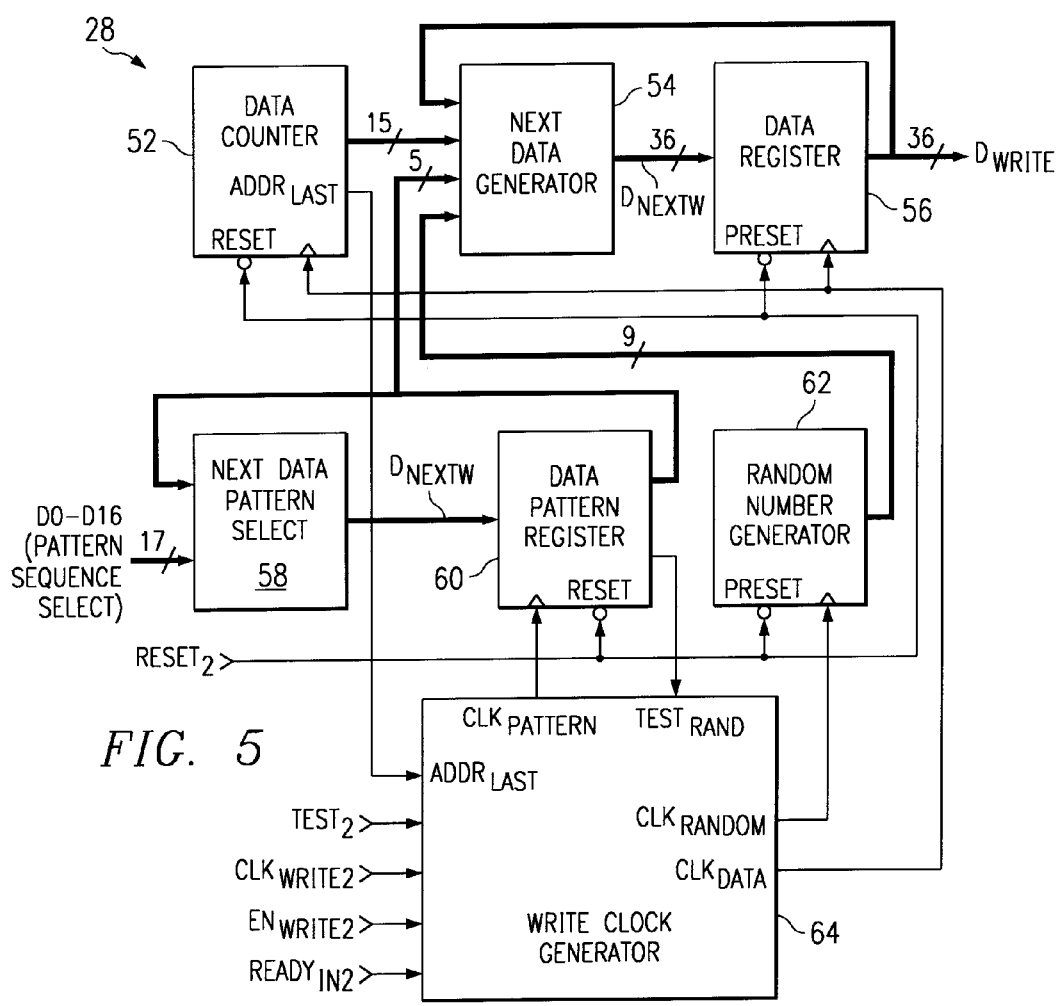
FIG. 5 illustrates the write data generator in accordance with the present invention.

FIG. 5 shows the logic of write data generator 28 of FIG. 2. Write data generator 28 includes data counter 52 is a 15-bit binary counter which is incremented upon each low-to-high transition of data clock input $Clk_{data}$ from write clock generator 64. A low-to-high transition of data clock input $Clk_{data}$ happens every time a valid memory write occurs when memory device 20 is in test mode operation. The number of unique states required within data counter 52 equals the depth of memory device 20. Data counter 52 provides a last address signal $Addr_{last}$. The last address output $Addr_{last}$ is high when data counter 52 reaches the final state before rolling back over to zero, which is used to advance data pattern register 60 to the next selected pattern in the sequence of the table shown. Data counter 52 supplies this count to next data generator 54 which generates the next word based upon inputs from data register 56, data pattern register 60, and random number generator 62.

Next data generator 54 stores the next data word in data register 56. Next data pattern select circuit 58 receives the pattern sequence select portion from the input data bus $D_2$ to generate a data pattern for selection of the next data pattern code. This next data pattern code is supplied to data pattern register 60 which supplies the 5-bit data pattern code to next data generator 54. The output from data pattern register 60 is a 5-bit binary code that represents the data code for the currently selected data pattern sequence as is shown in the table. This 5-bit binary code is updated on a low-to-high transition of data clock input $Clk_{data}$ which occurs when a write occurs and the last address $Addr_{last}$ from the data counter 52 is high.

Random number generator 62 provides a pseudo-random number to next data generator 54 for the purpose of generating the next data word. Write clock generator 64 receives the last address signal $Addr_{last}$, random test signal $Test_{rand}$, test signal $Test_2$, write clock signal $Clk_{write2}$, write enable signal $EN_{write2}$ and ready input signal $Ready_{in2}$ to provide clock data signal $Clk_{data}$, random clock signal $Clk_{random}$, and pattern clock signal $Clk_{pattern}$ to data pattern register 60, random number generator 62, data counter 52 and data register 56 as shown.

Combinatorial logic within next data generator 54 is used to set output $D_{nextw}$ to the states described above regarding the data pattern descriptions. The value of the output of data counter 52 is used to determine the next value for pattern codes '00000' through '01001'. Regarding pattern codes '01010', through '01111', data counter 52 and current data output $D_{write}$ values are used to determine the next value. For pattern code '10000', the 9-bit output of random number generator 62 is repeated four times to generate the next 36-bit word output $D_{nextw}$.

A low level on the reset signal $Reset_2$ clears all registers including data counter 52, data pattern register 60, and random number generator, whereby all bits are set low. A low level, however, on the reset signal input $Reset_2$ sets all bits of data register 56 high since the first data pattern during testing is always the "All 1's" data pattern.

Figure 6:
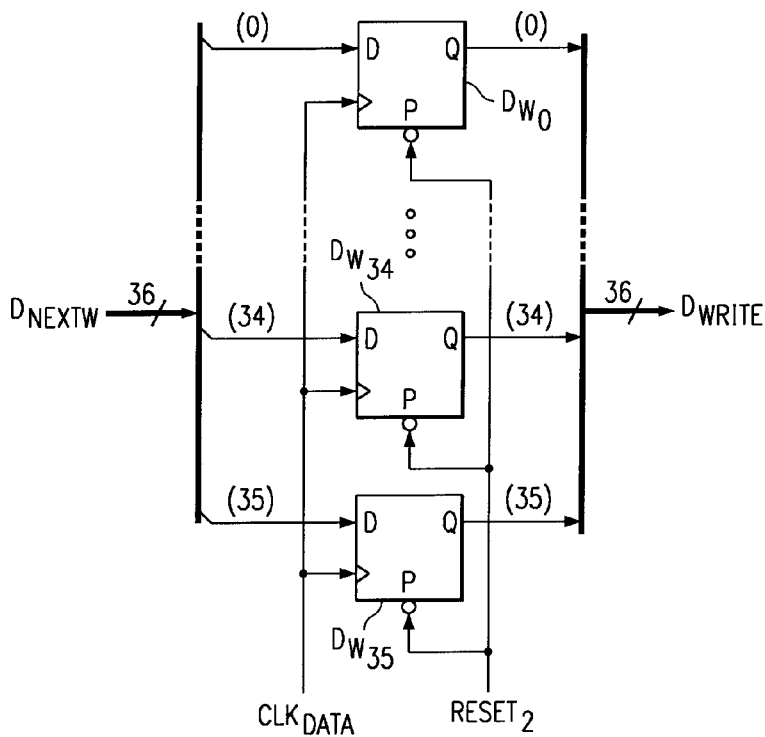
FIG. 6 shows the data register within the write data generator in accordance with the present invention.

FIG. 6 illustrates data register 56 of write data generator 22 as shown in FIG. 5. Data register 56 includes 36 D-type flip-flops, $Dw_0$–$Dw_{35}$, that get clocked on a low-to-high transition on the data clock input $Clk_{data}$ which occurs during every valid memory write while in the testing mode of operation.

As shown in FIG. 7, random number generator 62 is a state machine that uses 12 D-type flip-flops, $D_0'$–$D_{11}'$, wherein nine of flip-flop outputs $Out_{random}$ are used for a nine-bit output fed to the next data generator 54 as is shown in FIG. 5. A new output value is generated during a low-to-high transition of the random clock input $Clk_{random}$ received from write clock generator 64 which occurs every time a valid memory write occurs while memory device 20 is in test mode and data pattern 10000 is selected. Random number generator 62 uses feedback of the current state of the 12 bits to calculate a new state as is shown where the 8-input NAND gate 65 receives 8 bits of the current state. Feedback is provided to logic gates, $L_1$–$L_{12}$, through NAND gate 65. The pattern repeats after an odd number of cycles of random clock $Clk_{random}$. After pattern '10000' finishes and other patterns are run, random test resumes, such that random number generator 62 resumes from the last generated number. Thus, if testing is repeated long enough, each memory word will eventually receive every word in the random sequence.

Figure 8:
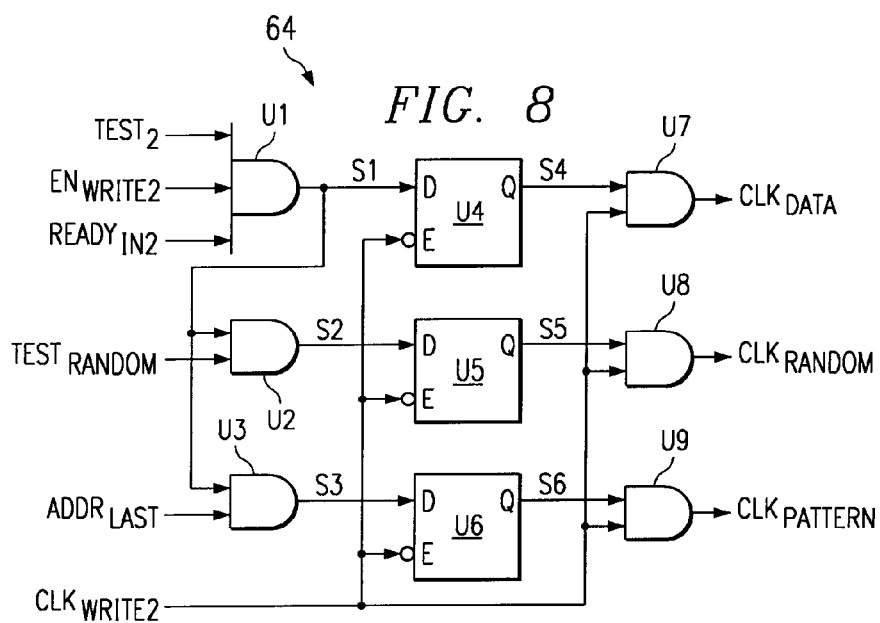
FIG. 8 shows the write clock generator in accordance with the present invention.

Write clock generator circuit 64 is illustrated in FIG. 8. AND gate $U_1$ receives input: signals test signal $Test_2$, write enable signal $EN_{write2}$, and input ready signal $Ready_{in2}$. When these signals are high simultaneously, signal $S_1$ will be high. When write clock $Clk_{write2}$ goes high, the value of signal $S_1$ is latched into D-Q flip-flop $U_4$, making output $S_4$ is high. As a result, data clock $Clk_{data}$ transitions to high, which causes data register 56 and data counter 52 to be clocked. When signal $S_1$ is high and random test $Test_{random}$ is high, signal $S_2$ will be high. As a result, the value of signal $S_2$ gets latched in NAND gate $U_5$ when write clock $Clk_{write2}$ goes high. Thereafter, random clock signal $Clk_{random}$ goes high, enabling random number generator 62 to generate a new random number value. When signal $S_1$ is high and last address $Addr_{last}$ is high, signal $S_3$ is forced high. The value of signal $S_3$ gets latched into D-Q flip-flop $U_6$, when write clock $Clk_{write2}$ goes high. As a result, pattern clock signal $Clk_{pattern}$ goes high. This signal $Clk_{pattern}$ clocks data pattern register 60, whereby a new pattern is selected.

Figure 9:
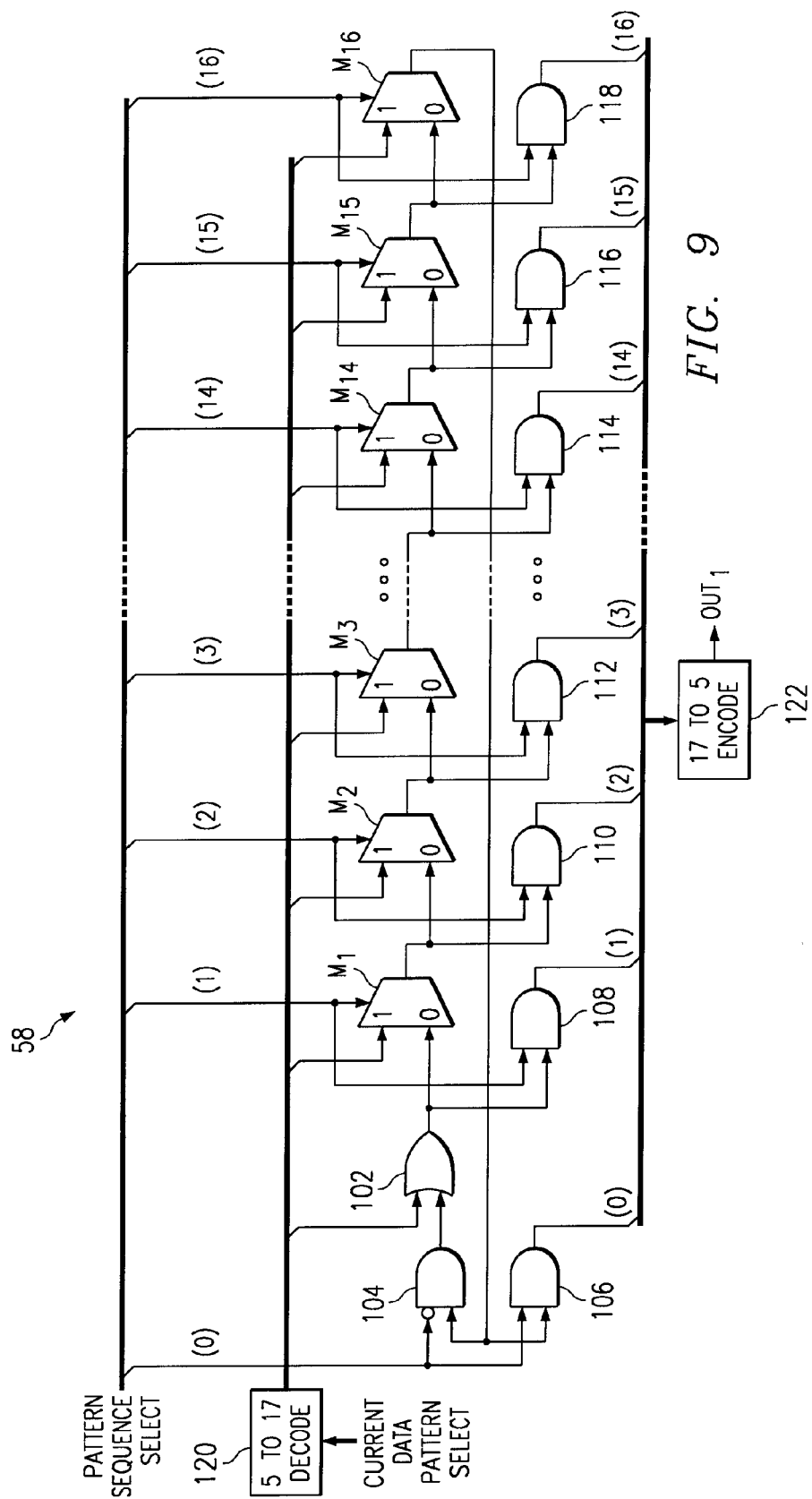
FIG. 9 illustrates the next data pattern select register in accordance with the present invention.

Next data pattern select logic 58 appears in FIG. 9. The 5-bit current data pattern select received from data pattern register 60 is decoded to a 17-bit word, $B_0$–$B_{16}$, where only one bit is high at a time. These are combined with the pattern sequence select inputs through a set of multiplexers, $M_1$–$M_{16}$, and logic gates, 102–118. As indicated previously, the pattern sequence select portion of a word on input data bus $D_2$ includes bits 0 to 16. Beginning with the current data pattern select decoded bit which is high progressing to the right most bit, the first simultaneous high bit of the pattern sequence select portion encountered indicates which will be the next pattern selected. When no high bit is encountered through to the last bit of the pattern sequence select portion, then the checking continues back through to the first bit 0 and the first bit is forced high on the pattern sequence select portion. Encoder 122 encodes the 17-bit word into a 5-bit next data pattern select output $Out_1$.

Figure 10:
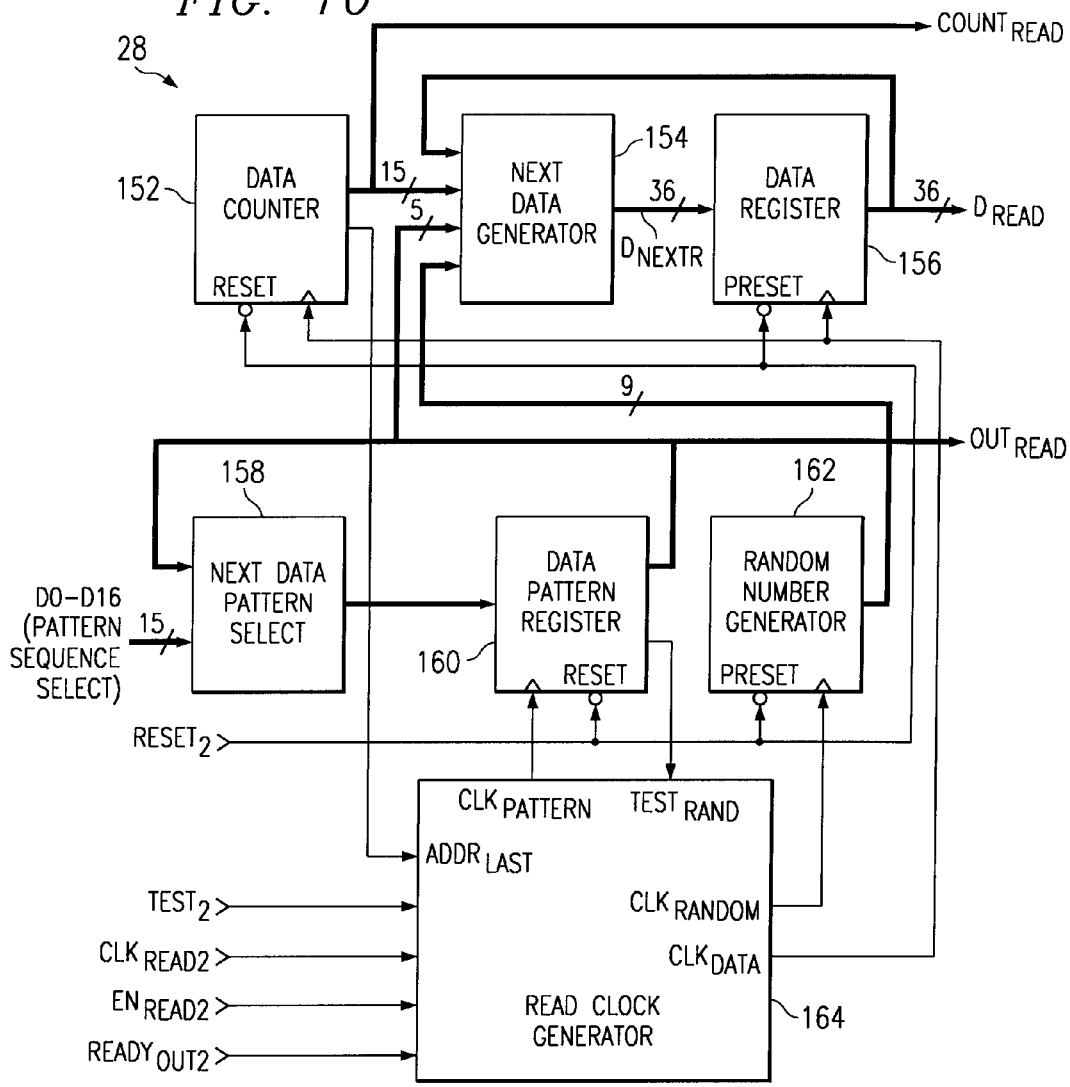
FIG. 10 displays the read data generator in accordance with the present invention.

FIG. 10 shows the logic of the read data generator 28 of FIG. 2. Each element: data counter 152, next data generator 154, data register 156, next data pattern select 158, data pattern generator 160 and random number generator 162, functions exactly the same as respective elements 52–62 of write data generator 22 as shown in FIG. 5. Distinctions, however are made regarding input signal to read data generator 28, wherein the read clock signal $Clk_{read2}$ replaces the write clock signal $Clk_{write2}$, the read enable signal $EN_{read2}$ replaces the write enable signal $EN_{write2}$, and the output ready signal $Ready_{out2}$ replaces the input ready signal $Ready_{in2}$. The output of read data generator 28 is expected read data $D_{read}$. If a read mismatch occurs, the current RAM read address and data pattern are utilized for further processing. The RAM read address is related to data counter value $Count_{read}$. As a result, the current RAM read address and data pattern are output on read count $Count_{read}$ and read data pattern select output node $Out_{read}$.

Figure 11:
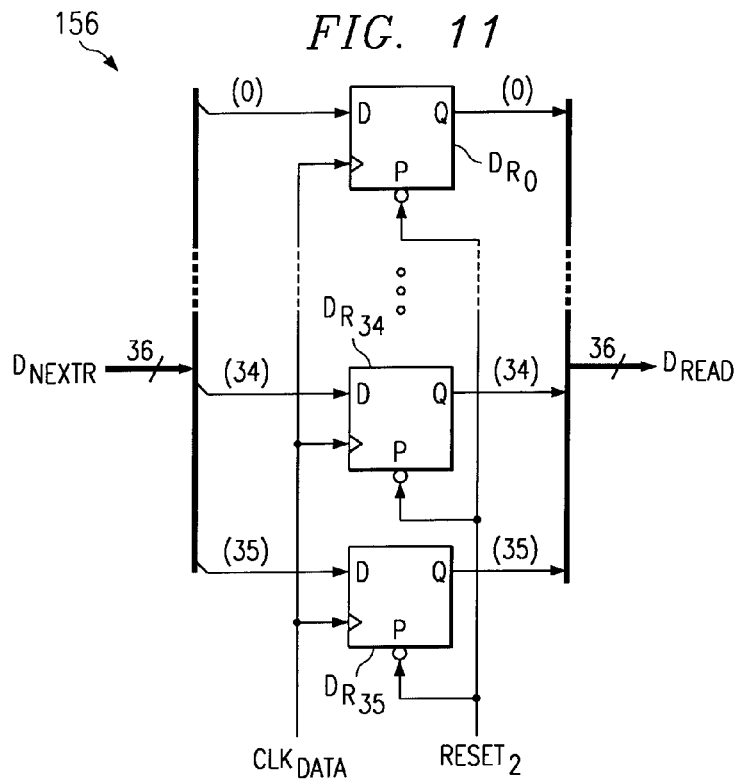
FIG. 11 shows the data register within the read data generator in accordance with the present invention.

FIG. 11 illustrates data register 156 of read data generator 28 as shown in FIG. 10. Data register 156 includes 36

D-type flip-flops, $DR_0$–$DR_{35}$, that get clocked on a low-to-high transition of data clock input $Clk_{data}$ which occurs during every valid memory read occurs while in the testing mode of operation. A low level on the reset signal input $Reset_2$ sets all bits high since the first data pattern during testing is always "All 1's" data pattern.

Figure 12:
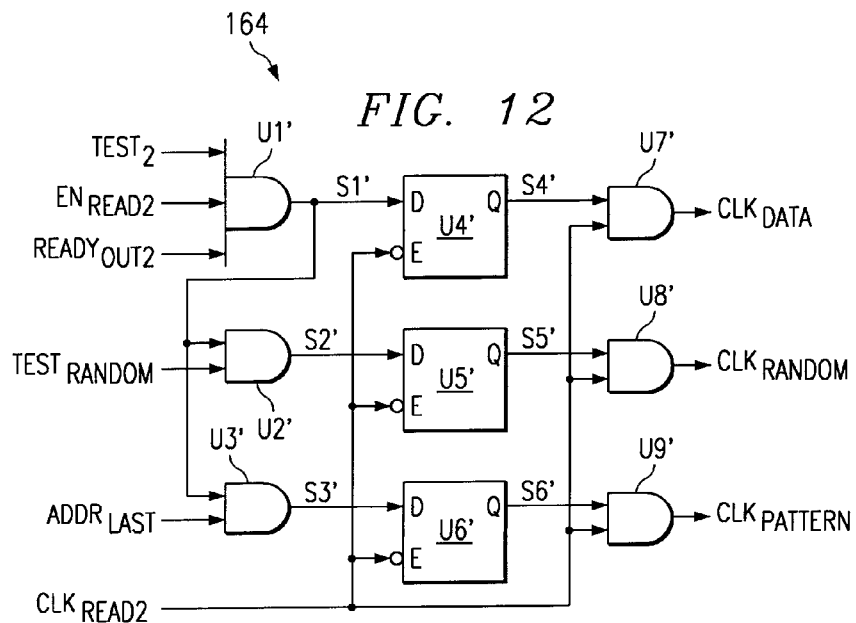
FIG. 12 illustrates the read clock generator in accordance with the present invention.

Shown in FIG. 12, read clock generator 164 supplies clocking signals: data clock $Clk_{data}$, random clock $Clk_{random}$, and pattern clock $Clk_{pattern}$. Read clock generator 164 functions in a manner identical to that of the write clock generator 64 of FIG. 8. AND gate $U'_1$ receives input: signals test signal $Test_2$, read enable signal $EN_{read2}$, and output ready signal $Read_{out2}$. When these signals are high simultaneously, signal $S'_1$ will be high. When read clock $Clk_{read2}$ goes high, the value of signal $S'_1$ is latched into D-Q flip-flop $U'_4$, making output $S'_4$ is high. As a result, data clock $Clk_{data}$ transitions to high, which causes data register 156 and data counter 152 to be clocked. When signal $S'_1$ is high and random test $Test_{random}$ is high, signal $S'_2$ will be high. As a result, the value of signal $S'_2$ gets latched in NAND gate $U'_5$ when read clock $Clk_{read2}$ goes high. Thereafter, random clock signal $Clk_{random}$ goes high, enabling random number generator 162 to generate a new random number value. When signal $S'_1$ is high and last address $Addr_{last}$ is high, signal $S'_3$ is forced high. The value of signal $S'_3$ gets latched into D-Q flip-flop $U'_6$, when read clock $Clk_{read2}$ goes high. As a result, pattern clock signal $Clk_{pattern}$ goes high. This signal $Clk_{pattern}$ clocks data pattern generator 160, whereby a new pattern is selected.

Figure 13:
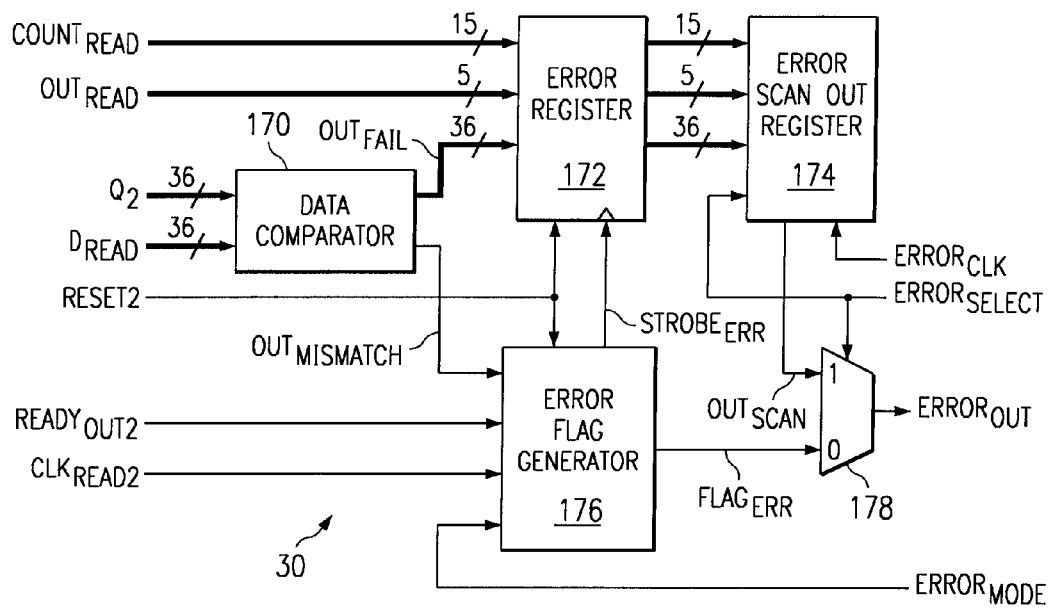
FIG. 13 displays the read data error logic in accordance with the present invention.

FIG. 13 displays read data error logic 30 from FIG. 2 which includes of data comparator 170, error register 172, error scan out register 174, error flag generator 176, and multiplexer 178. Read data error logic 30 compares the expected read data $D_{read}$ with the actual read data on output data bus $Q_2$ and generates an error flag $Flag_{err}$ if any mismatches occur. If mismatches occur, logic 30 stores some information regarding the failure and allows this information to be accessed serially external to memory device 20.

To minimize the number of memory device outputs, error output signal $Error_{out}$ from the read data error logic 30 is a multi-function signal. When select error signal $Error_{select}$ is low and the read data on output data bus $Q_2$ does not match the expected read data of read data generator 28, error output signal $Error_{out}$ will transition to high on the next read clock signal $Clk_{read}$ low-to-high transition. There are two modes for error indication depending upon input from error mode signal $Error_{mode}$. When error mode signal $Error_{mode}$ is low, error output signal $Error_{out}$ will transition to high on every mismatch and will remain high until there is no longer a mismatch. In contrast, when error mode signal $Error_{mode}$ is high, error output signal $Error_{out}$ will transition to high on the first mismatch and remain there indefinitely.

Figure 14:
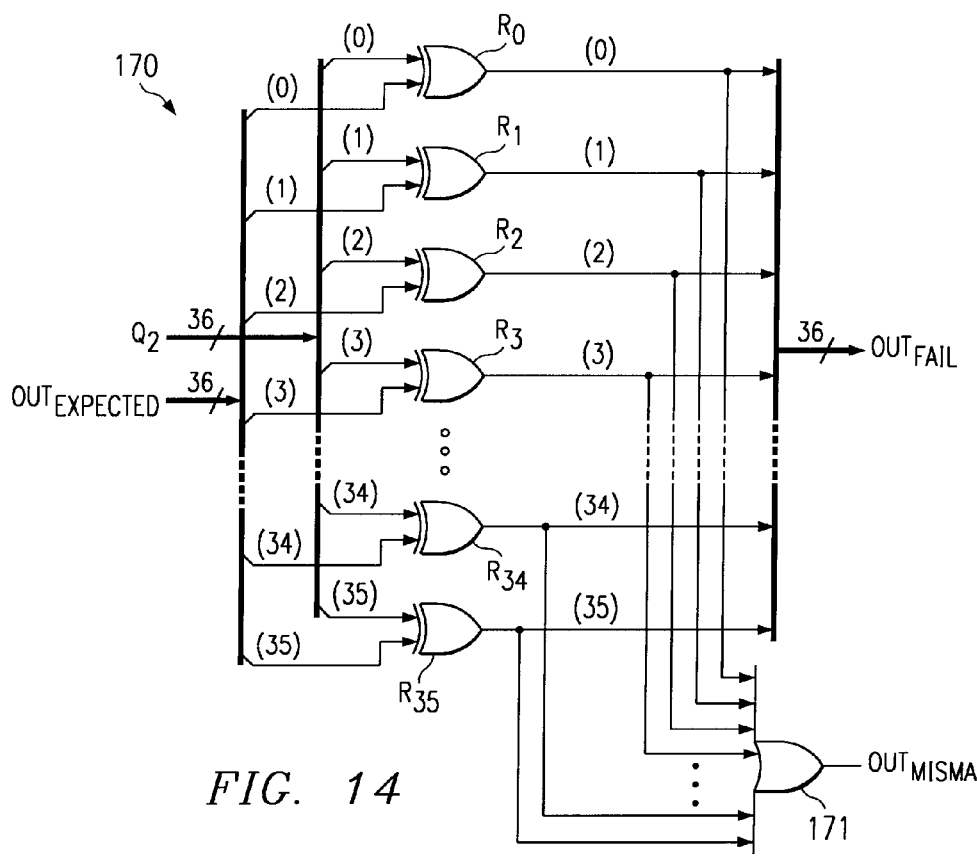
FIG. 14 shows the data comparator in accordance with the present invention.

FIG. 14 displays data comparator 170. Each bit of actual read data on output data bus $Q_2$ is compared to the corresponding bit of expected read data $D_{read}$ through XOR gates, $R_0$–$R_{35}$. The resultant bits appear on the failed bits output $Out_{fail}$, such that a high level indicates a mismatch. If there are one or more mismatches, then mismatch signal $Out_{mismatch}$ of AND gate 171 is high, indicating that one or more bit read errors has occurred.

Figure 15:
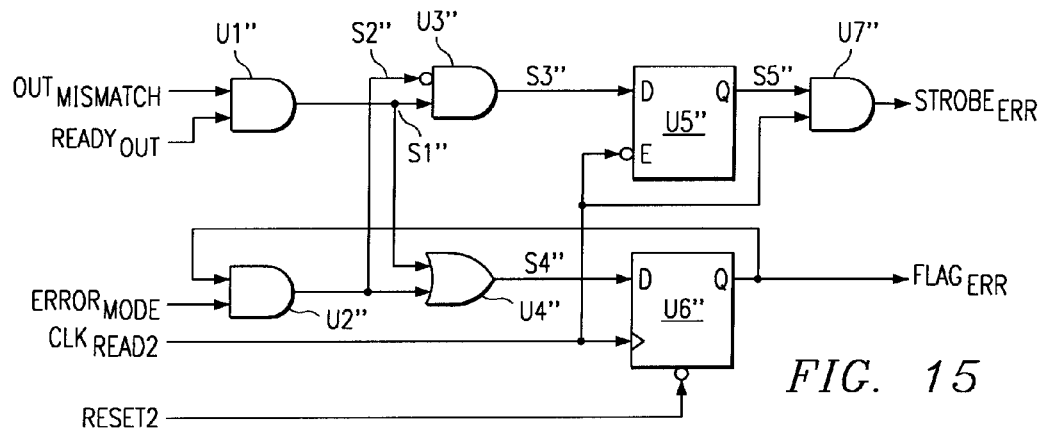
FIG. 15 illustrates the error flag generator in accordance with the present invention.

FIG. 15 illustrates error flag generator 176. After data is read, when output ready signal $Ready_{out}$ and mismatch signal $Out_{mismatch}$ are high, then signal $S_1''$ will be high. When error flag $Flag_{err}$ is low, signal $S_2''$ is low and signal $S_3''$ is high. When read clock $Clk_{read2}$ goes low after the read, signal $S_5''$ goes high. The next time read clock $Clk_{read2}$ goes high, error strobe signal $Strobe_{err}$ will transition high.

Since signal $S_1''$ is high, signal $S_4''$ will be high making error flag signal $Flag_{err}$ high when read clock $Clk_{read}$ transitions back to high. When error mode signal $Error_{mode}$ is low, signal $S_2''$ will be low. Therefore, as long as signal $S_1''$ is high, error strobe $Strobe_{err}$ will continue to pulse with read clock $Clk_{read2}$. When another read of data is initiated, where mismatch signal $Out_{mismatch}$ transitions low corresponding signals $S_1''$, $S_3''$, and $S_4''$ will be low. Accordingly, error flag signal $Flag_{err}$ returns low and error strobe signal $Strobe_{err}$ ceases pulsing. The first time signal $S_1''$ goes high, when error mode signal $Error_{mode}$ is high, error flag signal $Flag_{err}$ goes high and error strobe signal $Strobe_{err}$ pulses on the next read clock $Clk_{read}$ high pulse. Once error flag signal $Flag_{err}$ goes high, however, signal $S_4''$ remains high causing error flag signal $Flag_{err}$ to remain high and error strobe signal $Strobe_{err}$ to remain low on subsequent read clock $Clk_{read}$ pulses. Thus, when error mode signal $Error_{mode}$ is low, error strobe signal $Strobe_{err}$ pulses and error flag signal $Flag_{err}$ is high for every FIFO error. If error mode signal $Error_{mode}$ is high, error strobe signal $Strobe_{err}$ pulses once and error flag signal $Flag_{err}$ goes high and stays high on the first FIFO error. FIFO reset signal $Reset_2$ sets error flag signal $Flag_{err}$ low.

Figure 16:
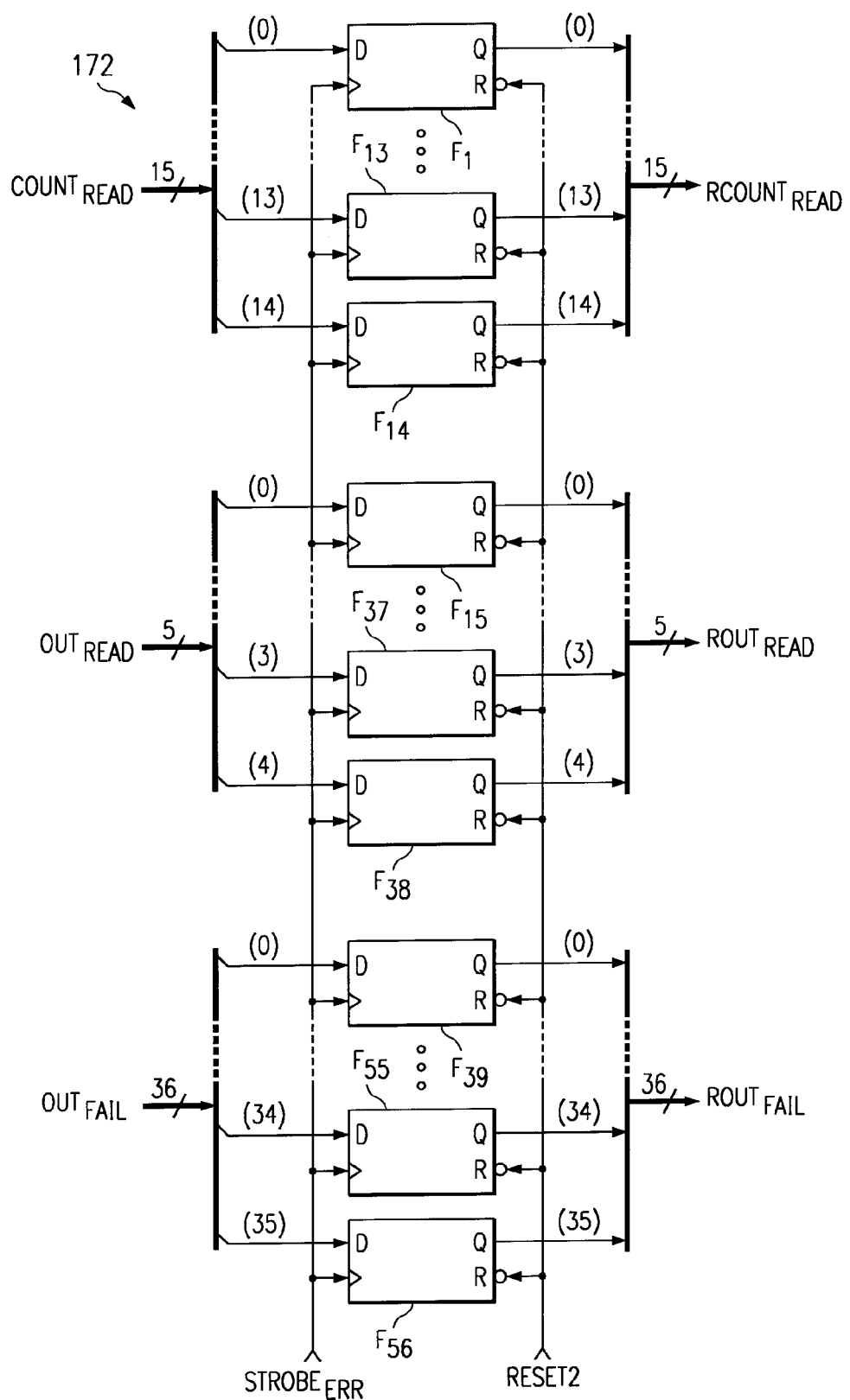
FIG. 16 displays the error register in accordance with the present invention.

FIG. 16 shows error register 172 which includes 56 D-type flip-flops, $F_1$–$F_{56}$. A low-to-high transition on error strobe signal $Strobe_{err}$ sets each Q output to the respective D input levels for each D-type flip-flops, $F_1$–$F_{56}$. Thus, outputs $RCount_{read}$, $ROut_{read}$ and $ROut_{fail}$ are set to the value of inputs $Count_{read}$, $Out_{read}$, and $Out_{fail}$, respectively. The failed bits $Out_{fail}$ received by register 172 indicate which bits have read mismatches, where a high level indicates a mismatch. The read data pattern select input $Out_{read}$ indicates which read data pattern occurs at the time of a read error. The read count input $Count_{read}$ indicates the read count which can be used to calculate the failing RAM read address. A low level on FIFO reset $Reset_2$ sets each Q output of flip-flops, $F_1$–$F_{56}$, to low.

Figure 17:
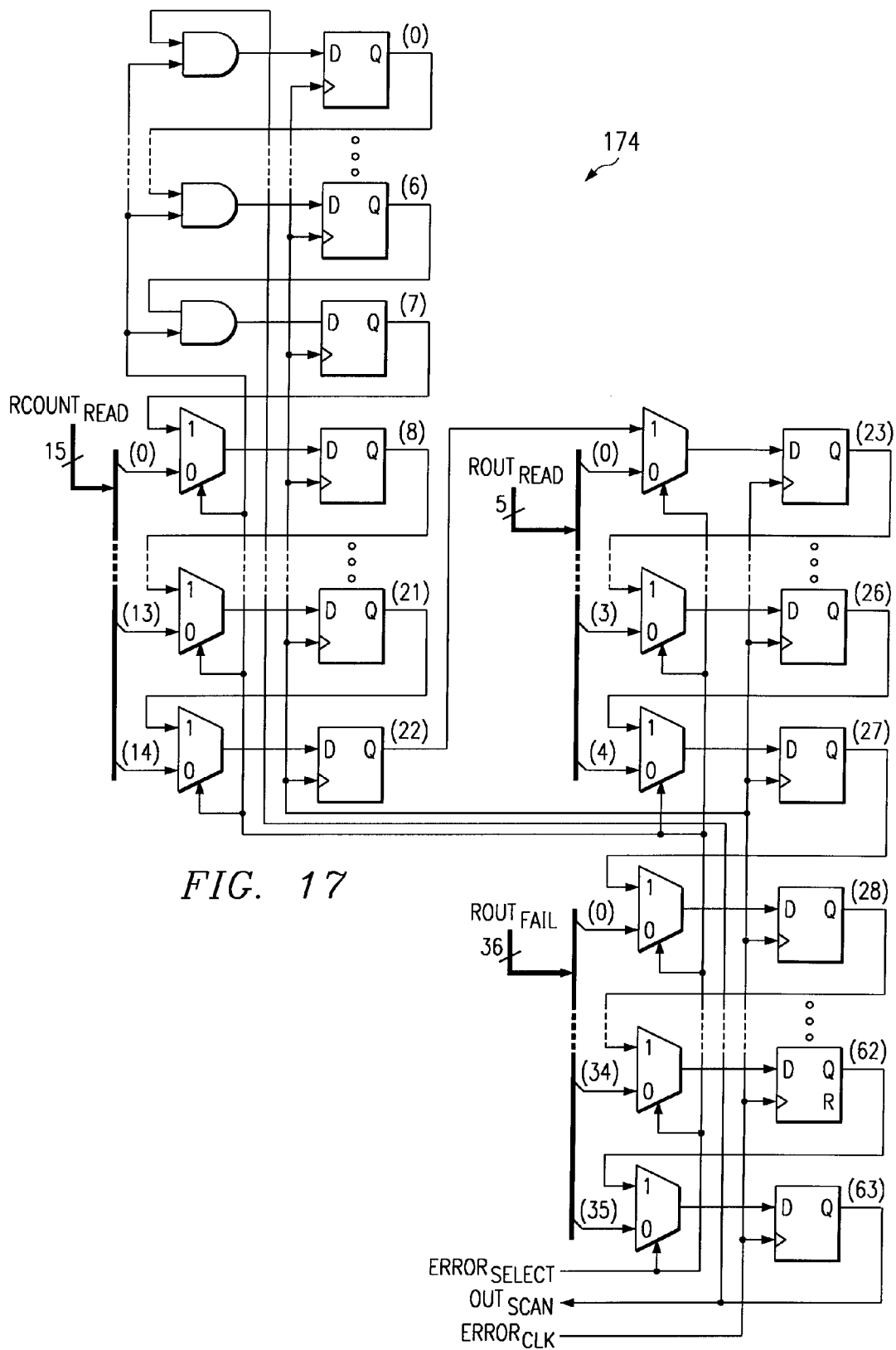
FIG. 17 shows the error scan-out register in accordance with the present invention.

Error scan out register 174, shown in FIG. 17, is a 64-bit parallel loadable shift register that receives outputs $RCount_{read}$, $ROut_{read}$ and $ROut_{fail}$ from error register 172. The error output clock $Error_{clk}$ is an input separate from write clock $Clk_{write2}$ and read clock $Clk_{read2}$. If the error select signal $Error_{select}$ is low and a low-to-high transition occurs on error output clock $Error_{clk}$, the values from the error register 172 get loaded into bits 8–63 of error scan out register 174, while bits 0–7 get set to low. Bit 63 automatically appears on the scan output $Out_{scan}$. If error select signal $Error_{select}$ is high and a low-to-high transition occurs on error output clock $Error_{clk}$, the bits are shifted out sequentially in descending order on scan output $Out_{scan}$. Once bit 0 is shifted out, the sequence begins again with bit 63.

When a mismatch causes error output signal $Error_{out}$ to go high, some information regarding the nature of the mismatch gets loaded into error scan-out register 174. In the current embodiment, this register is 64 bits in length. Bits 0 to 35 indicate which bit or bits have failed, with a high level indicating failure. Bits 36 to 50 indicate the memory address from which the failing word was read. Bits 51 to 55 indicate which type of data pattern is in use at the time of failure. The remaining eight bits are always low. While the error select signal $Error_{select}$, is low, if a low-to-high transition occurs on the error clock signal $Error_{clk}$, the contents of this register are transferred to an output shift register. When the error select signal $Error_{select}$ is high, the contents of register bit 0 appears on the output error signal $Error_{out}$. Further low-to-high transitions on the error clock signal $Error_{clk}$ cause the remaining bits to be shifted out serially to bit 63. Thereafter, the sequence starts over at bit 0.

Figure 18:
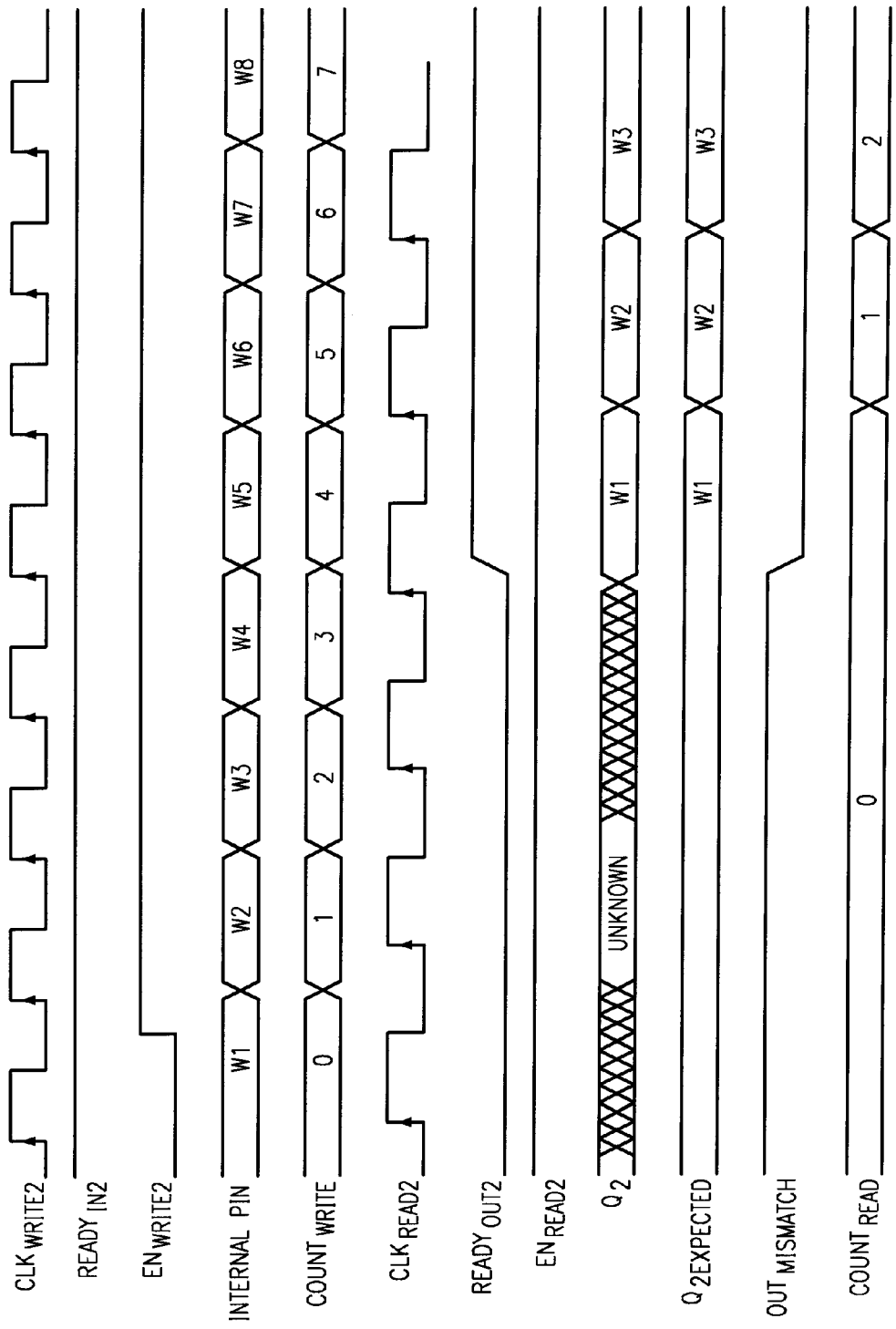
FIG. 18 displays a diagram for a FIFO write/read operation in accordance with the present invention.

A timing diagram for the FIFO write and read operations appears in FIG. 18. Initially, FIFO memory device 20 is empty, causing input ready Ready$_{in2}$ to be high. While in the testing mode of operation, a new input data word is generated on a low-to-high transition of the write clock Clk$_{write2}$ when write enable EN$_{write2}$ and input ready Ready$_{in2}$ are high. As a result, the write data count of data counter 52 is incremented. Once the first word is written, the written data appears on output Q$_2$ when output ready Ready$_{out2}$ goes high, after several read clock Clk$_{read2}$ cycles. Before such time, however, output Q$_2$ is unknown. Since output Q$_2$ is unknown, it may not match expected output Q$_{2expected}$ and, therefore, mismatch Out$_{mismatch}$ is high. However, since output ready Ready$_{out2}$ is low at this time, no error is generated. Once output ready Ready$_{out2}$ is high, new data words are read out and new expected data words are generated on a low-to-high transition on read clock Clk$_{read2}$ when read enable EN$_{read2}$ is high.

Figure 19:
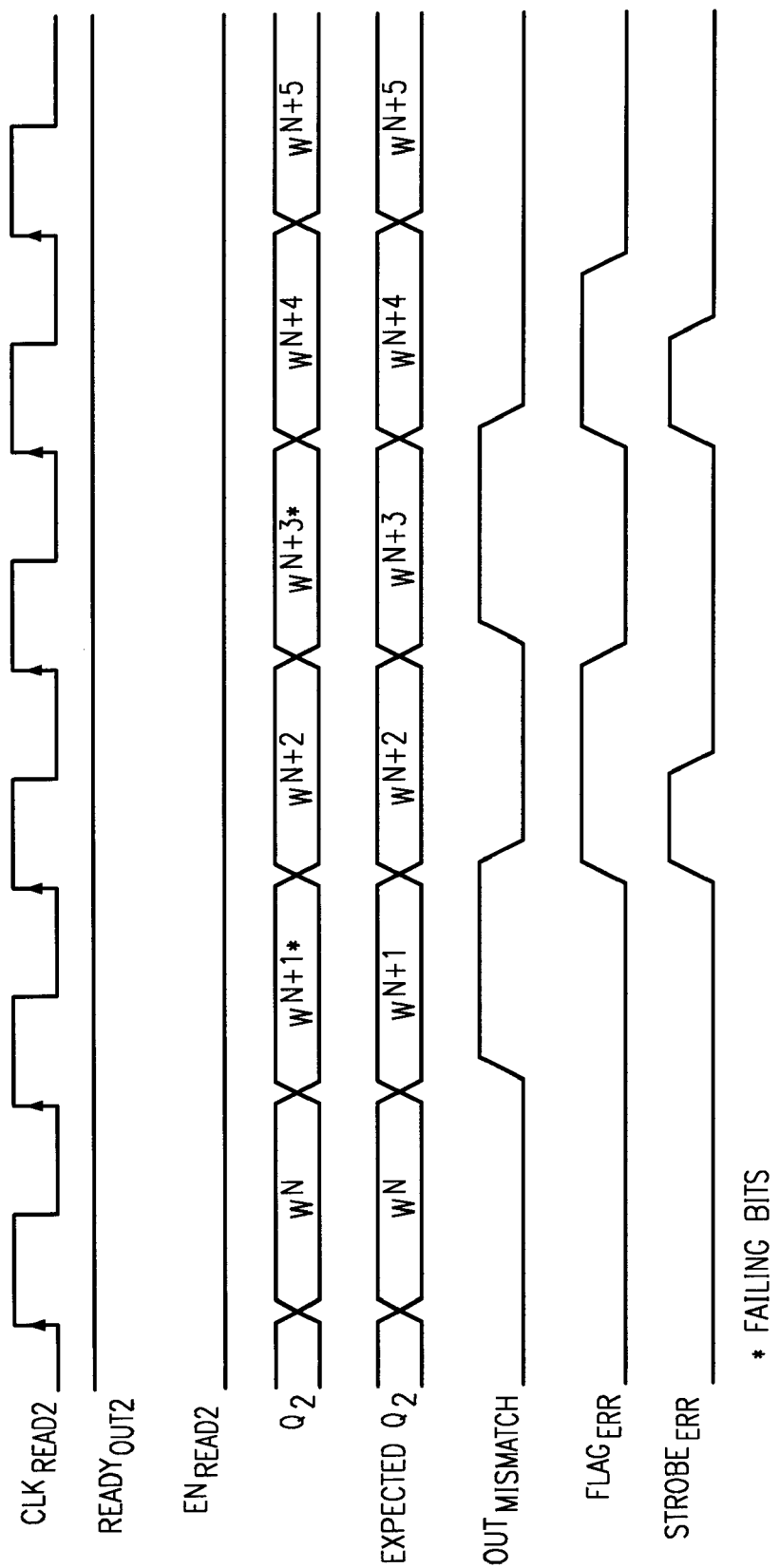
FIG. 19 illustrates a timing diagram representing signals during a FIFO read operation having read errors in the all error mode.
Figure 20:
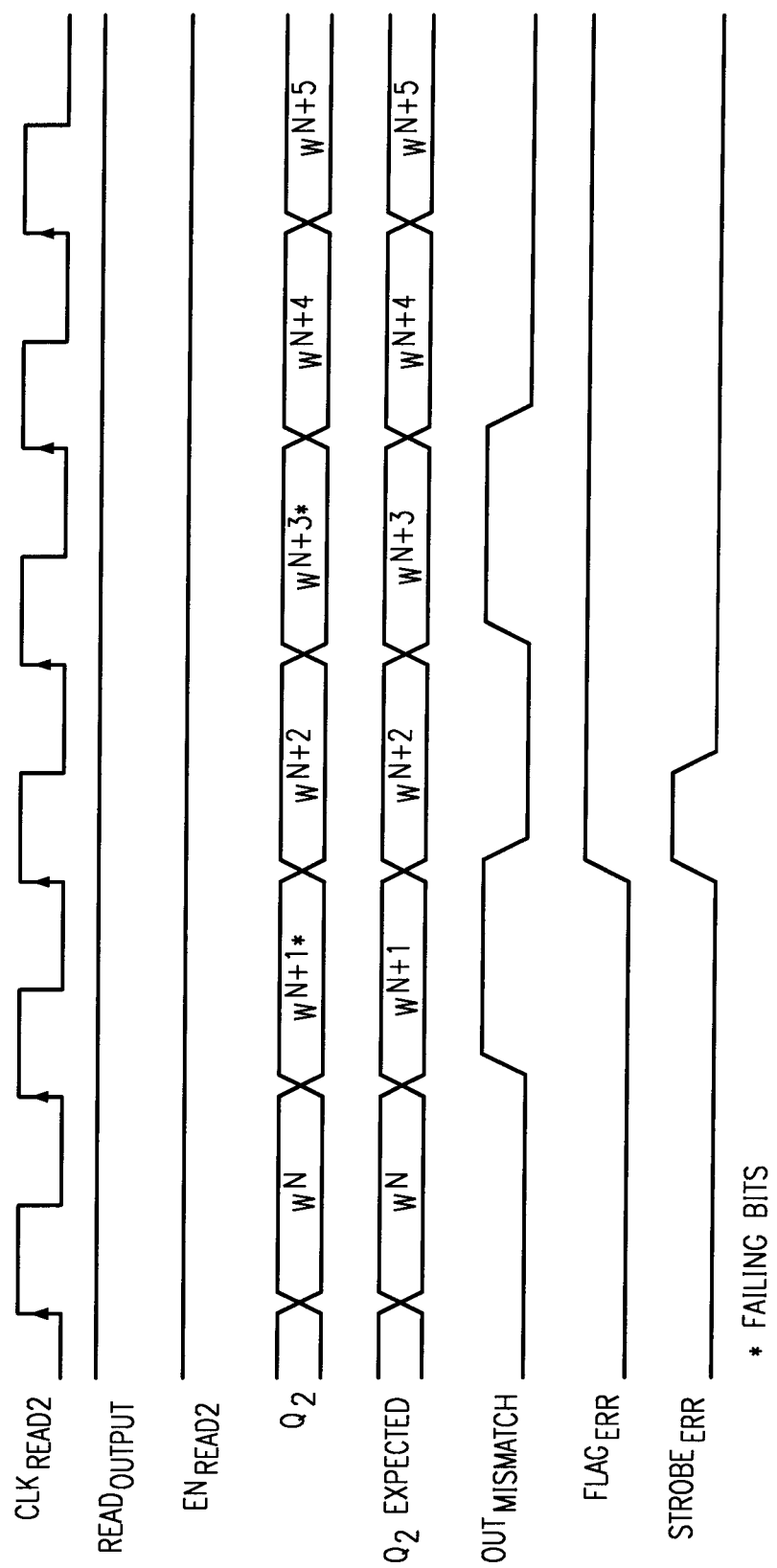
FIG. 20 shows a timing diagram representing signals during a FIFO read operation having read errors in the first only error mode.

Read timing with output Q$_2$ errors appears in FIGS. 19 and 20. Any time output Q$_2$ does not match expected output Q$_2$, mismatch Out$_{mismatch}$ is high. When output ready Ready$_{out\_2}$ is high simultaneously, then error flag Flag$_{err}$ goes high on the next low-to-high transition on read clock Clk$_{read2}$. Error strobe signal Strobe$_{err}$ also pulses responsive to read clock Clk$_{read2}$ at this time causing the failed bit Out$_{fail}$, read data count Count$_{read}$, and read data pattern select information Out$_{read}$ to be clocked into the error register 172. When error mode signal Error$_{mode}$ is low as is the case for FIG. 19, error flag Flag$_{err}$ returns to low when mismatch Out$_{mismatch}$ returns to low. Subsequent errors cause error flag Flag$_{err}$ to return to high and error strobe signal Strobe$_{err}$ to pulse. In contrast, when error mode signal Error$_{mode}$ is high as is the case for FIG. 20; however, error flag Flag$_{err}$ goes high and remains high on the first error and error strobe signal Strobe$_{err}$ pulses only once, where subsequent errors are ignored.

Figure 21:
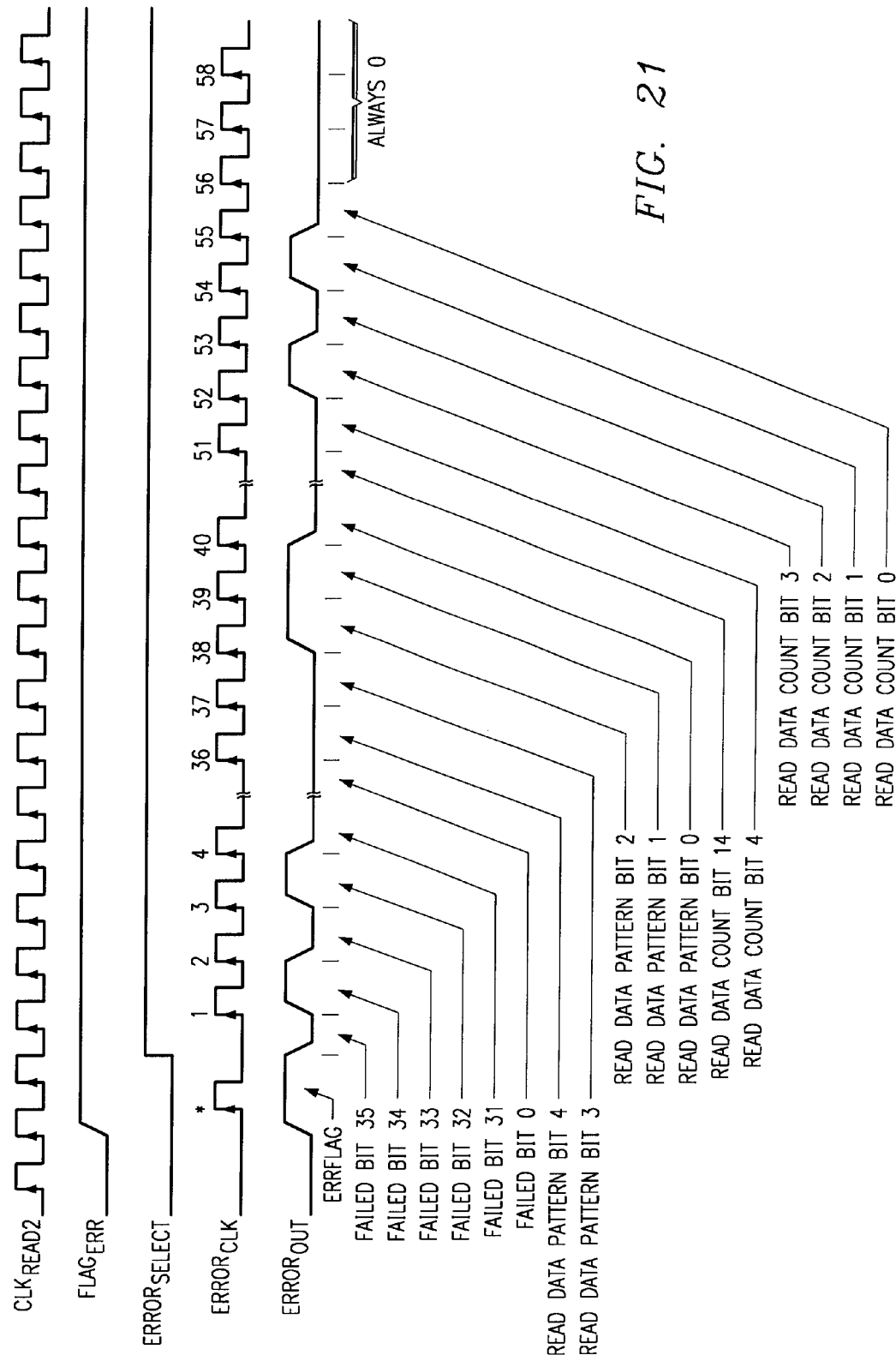
FIG. 21 displays a timing diagram representing signal during a error scan-out.

FIG. 21 shows timing for retrieving the stored error information after a mismatch occurs. When error select signal Error$_{select}$ is low, error flag Flag$_{err}$ is selected for output error signal Error$_{out}$. A low-to-high transition on error output clock Error$_{clk}$ loads error information into error scan out register 174. When error select signal Error$_{select}$ is high, the 64-bit error scan out register 174 is selected for output error signal Error$_{out}$ with bit 63 being the first to be output. Subsequent low-to-high transitions on error output clock Error$_{clk}$ cause the remaining bits to be shifted out. Once bit 0 is reached, the pattern repeats from bit 63.

Advantages of this design include but are not limited to an asynchronous FIFO memory device including a Built-In Self Test logic having a high performance, simple, and cost effective design that uses minimal external test equipment to implement full frequency asynchronous testing of memory device 20.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A memory based First-in-First-Out device, having a input data bus, a output data bus, comprising:

a random access memory, having a plurality words of memory, each word having a plurality of bit width, each word of memory addressed by one of a plurality of addresses, the output of the random access memory coupled to the output data bus;

a read address generator for addressing one of the plurality of addresses at a time to be read from the random access memory through the output data bus;

a write address generator for addressing one of the plurality of addresses at a time to be written to the random access memory through the input data bus;

a status flag generator coupled to the write address generator and read address generator to provide a ready input and a ready output signal, respectively, wherein the ready input signal indicates that the random access memory is not full and is ready to accept a data write, and wherein the ready output signal indicates that valid data is on the output data bus;

a write data generator coupled to receive a multi-bit pattern sequence select portion from the word on the input data bus to generate a plurality of write data patterns corresponding to each n words of memory;

a first multiplexer coupled to the input data bus and the write data generator, the first multiplexer coupled to receive a test mode input signal, the multiplexer in response to the test mode signal switches to provide words from the input data bus to the random access memory in a normal mode of operation and to provide words from the write, data generator to the random access memory in a testing mode of operation;

a read data generator coupled to the input data bus to generate a plurality of expected read data patterns corresponding to each n words of memory; and a read data error register coupled to the read data generator and the output data bus operative to compare each bit on the output data bus with each bit of the expected read data pattern, the read data error register operative to generate at least one error signal when the bit on the output data bus and the bit on the expected read data pattern are not equivalent.

2. The memory based First-In-First-Out device, according to claim 1, wherein the write data generator, comprises:

a data counter to count each word generated and to provide a last address signal;

a next data generator coupled to the data counter to generate the next word and a last address signal;

a data register, having an input and an output, the input coupled to receive the next word to store the word generated, the output coupled to the next data generator to provide feedback;

a next data pattern select circuit coupled to the next data generator, next data pattern select circuit coupled to receive the pattern sequence select portion from the input data bus to generate a data pattern for selection of the next word;

a data pattern register coupled between the output of the next data pattern select circuit and the next data generator to provide a random test signal, the next data generator coupled to receive the random test signal;

a random number generator coupled to the next data generator to provide a pseudo-random number, the next data generator coupled to receive the pseudo-random number; and a write clock generator coupled receive the last address signal, the random test signal, the test mode signal, the write clock signal, the write enable signal and the ready input signal to provide at least one clock signal to the data pattern register, random number generator, the data counter and the data register.

3. The memory based First-In-First-Out device, according to claim 2, wherein the next data pattern select circuit comprises:

a decoder coupled to receive a current data pattern select word of a first bit width to decode the current data pattern select word into a word of a second bit width;

a primary stage, having an output, comprising,
 a first AND gate coupled to receive the first bit of the next pattern sequence select portion,
 a first OR gate coupled to receive the output of the first AND gate and the first bit of the decoded current data pattern select word, and
 a second AND gate coupled to receive the first bit of the next pattern sequence select portion;

at least one secondary stage, each having an output, comprising,
 a multiplexer coupled to receive the output of the previous stage, one bit of the next pattern sequence select portion and one corresponding bit of the decoded current data pattern select word, and
 a third AND gate coupled to receive a bit of the next pattern sequence select portion and the output of the previous stage,
 wherein the output of the last secondary stage coupled to the input of the first and second AND gates of the primary stage; and an encoder coupled to receive the output of the second AND gate of the primary stage and the outputs of the third AND gate from each of the secondary stages to form a word having the second bit width and to convert the word into a word having the first bit width.

4. The memory based First-In-First-Out device, according to claim 2, wherein the random number generator, having an output, comprises:

a plurality of multi-input XOR gates each coupled to receive a plurality of bits of the current random number word; and a plurality of D-Q flip-flops each one coupled to receive the one output of the plurality of multi-input XOR gates, certain ones of the outputs of the plurality of the D-Q flip-flops provide a next random number word at the output of the random number generator, an AND gate coupled to receive a portion of the outputs of the plurality of D-Q flip-flops to feedback to certain ones of the output to the inputs of the plurality of multi-input XOR gates;

an inverter coupled to receive the output of the AND gate to feedback to certain ones of the inputs of the plurality of multi-input XOR gates.

5. The memory based First-In-First-Out device, according to claim 2, wherein the write clock generation comprises:

a first AND gate coupled to receive the test mode signal, the write enable signal and the read input signal;

a second AND gate coupled to receive the output of the first AND gate and the random test signal a third AND gate coupled to receive the output of the first AND gate and the last address signal;

a first D-Q flip-flop coupled to receive the output of the first AND gate;

a second D-Q flip-flop coupled to receive the output of the second AND gate;

a third D-Q flip-flop coupled to receive the output of the third AND gate;

a fourth AND gate coupled to receive the output of the first D-Q flip-flop and the write clock signal to provide a data clock signal;

a fifth AND gate coupled to receive the output of the second D-Q flip-flop and the write clock signal to provide a random clock signal; and a sixth AND gate coupled to receive the output of the third D-Q flip-flop and the write clock signal to provide a pattern clock signal.

6. The memory based First-In-First-Out device, according to claim 1, wherein the read data generator, comprises:

a data counter to provide a last address signal and to count each word generated, wherein a read count is supplied at the output of the data counter;

a next data generator coupled to the data counter to generate the next word and a last address signal;

a data register coupled to the next data generator to store the word generated and to provide an expected output word;

a next data pattern select circuit coupled to the next data generator, next data pattern select circuit coupled to receive the pattern sequence select portion from the input data bus to generate a data pattern for selection of the next word;

a data pattern register coupled between the output of the next data pattern select circuit and the next data generator to provide an output read word and a random test signal;

a random number generator coupled to the next data generator; and a read clock generator coupled receive the last address signal, the random test signal, the test mode signal, the read clock signal, the read enable signal and the ready output signal to provide at least one clock signal to the data pattern register, random number generator, the data counter and the data register.

7. The memory based First-In-First-Out device, according to claim 6, wherein the next data pattern select logic comprises:

a decoder coupled to receive a current data pattern select word having a first bit width to decode the current data pattern select word into a word having a second bit width;

a primary stage, having an output, comprising,
 a first AND gate coupled to receive the first bit of the next pattern sequence select portion,
 a first OR gate coupled to receive the output of the first AND gate and the first bit of the decoded current data pattern select word, and
 a second AND gate coupled to receive the first bit of the next pattern sequence select portion;

at least one secondary stage, each having an output, comprising, a multiplexer coupled to receive the output of the previous stage, one bit of the next pattern sequence select portion and one corresponding bit of the decoded current data pattern select word, and a third AND gate coupled to receive a bit of the next pattern sequence select portion and the output of the previous stage, wherein the output of the last secondary stage coupled to the input of the first and second AND gates of the primary stage; and an encoder coupled to receive the output of the second AND gate of the primary stage and the outputs of the third AND gate from each of the secondary stages to form a word having the second bit width and to convert the word into a word having the first bit width.

8. The memory based First-In-First-Out device, according to claim 6, wherein the random number generator comprises:

a plurality of multi-input XOR gates each coupled to receive a plurality of bits of the current random number word;

a plurality of D-Q flip-flops each one coupled to receive the one output of the plurality of multi-input XOR gates, certain ones of the outputs of the plurality of the D-Q flip-flops provide a next random number word at the output of the random number generator;

an AND gate coupled to receive a portion of the outputs of the plurality of D-Q flip-flops to feedback to certain ones of the output to the inputs of the plurality of multi-input XOR gates; and an inverter coupled to receive the output of the AND gate to feedback to certain ones of the inputs of the plurality of multi-input XOR gates.

9. The memory based First-In-First-Out device, according to claim 6, wherein the read clock generation comprises:

a first AND gate coupled to receive the test mode signal, the read enable signal and the read output signal;

a second AND gate coupled to receive the output of the first AND gate and the random test signal a third AND gate coupled to receive the output of the first AND gate and the last address signal;

a first D-Q flip-flop coupled to receive the output of the first AND gate;

a second D-Q flip-flop coupled to receive the output of the second AND gate;

a third D-Q flip-flop coupled to receive the output of the third AND gate;

a fourth AND gate coupled to receive the output of the first D-Q flip-flop and the write clock signal to provide a data clock signal;

a fifth AND gate coupled to receive the output of the second D-Q flip-flop and the write clock signal to provide a random clock signal; and a sixth AND gate coupled to receive the output of the third D-Q flip-flop and the write clock signal to provide a pattern clock signal.

10. The memory based First-In-First-Out device, according to claim 1, wherein the read data error register, comprises a data comparator coupled to receive data from the output data bus and the expected output word to provide a failure output word;

an error register coupled to receive the failure output word, the output ready signal and the read count;

an error scan-out register coupled to the error register to provide an output scan signal, the error scan-out register coupled to receive an error clock and an error select signal for controlling the error scan-out register;

an error flag generator coupled to receive the mismatch output signal, the ready output signal, an error mode signal and the read clock signal; and a second multiplexer coupled to the error flag generator and coupled to receive the output scan signal.

11. The memory based First-In-First-Out device, according to claim 10, wherein the data comparator comprises:

a plurality of XOR gates, each having a first and second input and an output, each XOR gate one coupled to receive a bit from the output data bus and a bit from the expected output word, the outputs of the plurality of XOR gates provide the failure output word; and a multi-input OR gate coupled to received the outputs of the plurality of XOR gates to provide the mismatch output signal.

12. The memory based First-In-First-Out device, according to claim 10, wherein the error flag generator, comprises:

a first AND gate coupled to receive the mismatch output signal and the output ready signal;

a second AND gate coupled to receive an error mode signal;

a third AND gate coupled to the first AND gate and the second AND gate;

an OR gate coupled to the first AND gate and the second AND gate;

a first D-Q flip-flop coupled to the third AND gate;

a second D-Q flip-flop coupled to the OR gate to provide a flag error signal; and a fourth AND gate coupled to the first D-Q flip-flop and coupled to receive the read clock signal to provide a strobe error signal.

13. The memory based First-In-First-Out device, according to claim 10, wherein the error register comprises:

at least three groups having a plurality of D-Q flip-flops, the first group coupled to receive the read count word to provide a registered read count word wherein each bit of the read count word coupled to one of the plurality of D-Q flip-flops of the first group, the second group coupled to receive the output read word to provide a registered output read word wherein each bit of the output read word coupled to one of the plurality of D-Q flip-flops of the second group, the third group coupled to receive the failure output word to provide a registered failure output word wherein each bit of the failure output word coupled to one of the plurality of D-Q flip-flops of the third group.

14. The memory based First-In-First-Out device, according to claim 10, wherein the error scan-out register comprises:

at least three groups having a plurality of multiplexers, the first group coupled to receive the registered read count word, the second group coupled to receive the registered output read word, the third group coupled to receive the registered failure output word;

at least three groups having a plurality of D-Q flip-flops, the first group coupled to the first group of the plurality of multiplexers, the second group coupled to the second group of the plurality of multiplexers, the third group coupled to the first group of the plurality of multiplexers;

wherein the output of each D-Q flip-flop of the first group coupled to the input of the next one of the plurality of multiplexers of the with the first group, the output of the last D-Q flip-flop of the first group coupled to the input of the first one of the plurality of multiplexers of the second group;

wherein the output of each D-Q flip-flop of the second group coupled to the input of the next one of the plurality of multiplexers of the with the second group, the output of the last D-Q flip-flop of the second group coupled to the input of the first one of the plurality of multiplexers of the third group;

wherein the output of each D-Q flip-flop of the third group coupled to the input of the next one of the plurality of multiplexers of the with the third group;

a plurality of AND gates coupled to receive the error select signal, the first AND gate coupled to receive the last output of the third group of D-Q flip-flops; and a fourth group of a plurality of D-Q flip-flops each one of the plurality of D-Q flip-flops coupled to one of the plurality of AND gates, the output of each D-Q flip-flop coupled to the input of one of the plurality of AND gates.

* * * * *